United States Patent
Tsukada et al.

(10) Patent No.: US 8,327,533 B2
(45) Date of Patent: Dec. 11, 2012

(54) PRINTED WIRING BOARD WITH RESIN COMPLEX LAYER AND MANUFACTURING METHOD THEREOF

(75) Inventors: Kiyotaka Tsukada, Ogaki (JP); Takamichi Sugiura, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 670 days.

(21) Appl. No.: 12/407,685

(22) Filed: Mar. 19, 2009

(65) Prior Publication Data

US 2009/0236128 A1    Sep. 24, 2009

Related U.S. Application Data

(60) Provisional application No. 61/038,473, filed on Mar. 21, 2008.

(51) Int. Cl.
*H05K 3/38* (2006.01)
*H05K 3/46* (2006.01)
*H05K 3/42* (2006.01)

(52) U.S. Cl. .............................. 29/847; 29/830; 174/258

(58) Field of Classification Search ................... 29/830, 29/846, 847; 174/258
See application file for complete search history.

(56) References Cited

U.S. PATENT DOCUMENTS

| | | | |
|---|---|---|---|
| 6,038,133 A | 3/2000 | Nakatani et al. | |
| 6,342,682 B1 * | 1/2002 | Mori et al. | 174/262 |
| 6,370,013 B1 | 4/2002 | Iino et al. | |
| 6,724,638 B1 | 4/2004 | Inagaki et al. | |
| 2005/0039948 A1 | 2/2005 | Asai et al. | |
| 2006/0191711 A1 | 8/2006 | Cho et al. | |
| 2007/0227765 A1 | 10/2007 | Sakamoto et al. | |
| 2009/0008765 A1 | 1/2009 | Yamano et al. | |

FOREIGN PATENT DOCUMENTS

| | | |
|---|---|---|
| JP | 05-037151 | 2/1993 |
| JP | 11-220262 | 8/1999 |
| JP | 2007-019267 A | 1/2007 |
| JP | 2007-049004 A | 2/2007 |
| JP | 2007-088009 A | 4/2007 |
| JP | 2008-010885 A | 1/2008 |
| WO | WO 2004/089048 A1 | 10/2004 |
| WO | WO 2005/104635 A1 | 11/2005 |

* cited by examiner

*Primary Examiner* — Livius R Cazan

(74) *Attorney, Agent, or Firm* — Oblon, Spivak, McClelland, Maier & Neustadt, L.L.P.

(57) ABSTRACT

A multilayer printed wiring board is manufactured by a method in which a core substrate is provided, an insulation layer including a thermosetting resin material is formed over the core substrate, an uncured resin layer including a thermoplastic resin material is placed on the insulation layer, the uncured resin layer is cured to form a resin complex layer including a resin complex comprising the thermosetting resin material and the thermoplastic resin material, and a conductive circuit is formed over the resin complex layer.

22 Claims, 23 Drawing Sheets

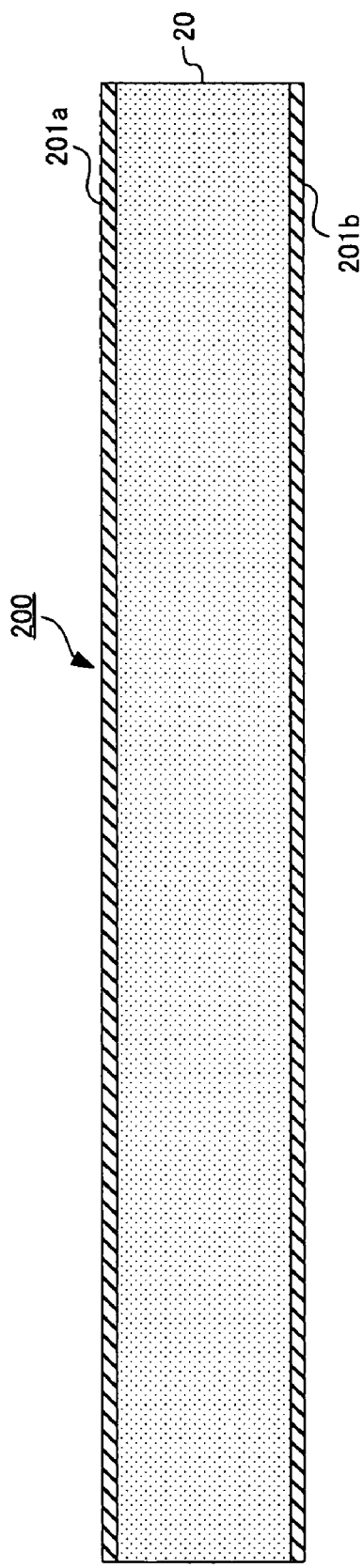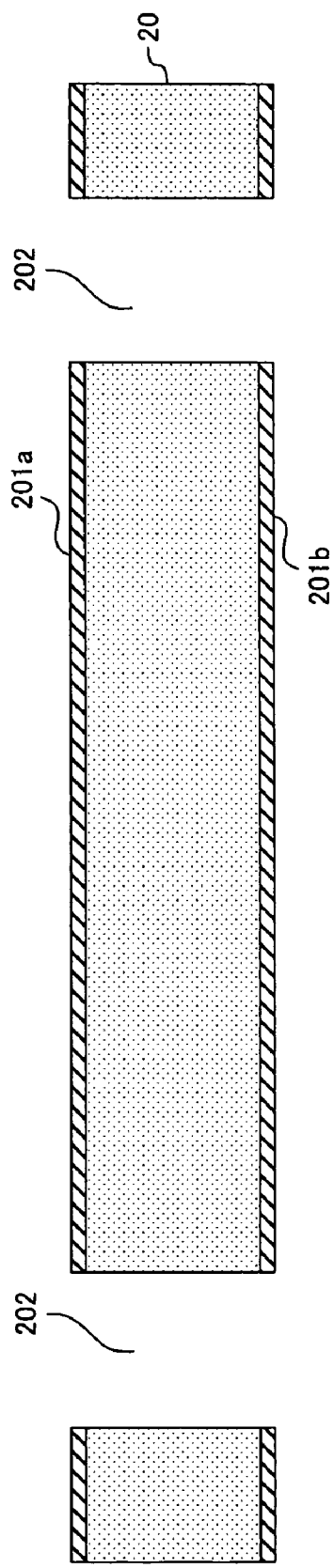

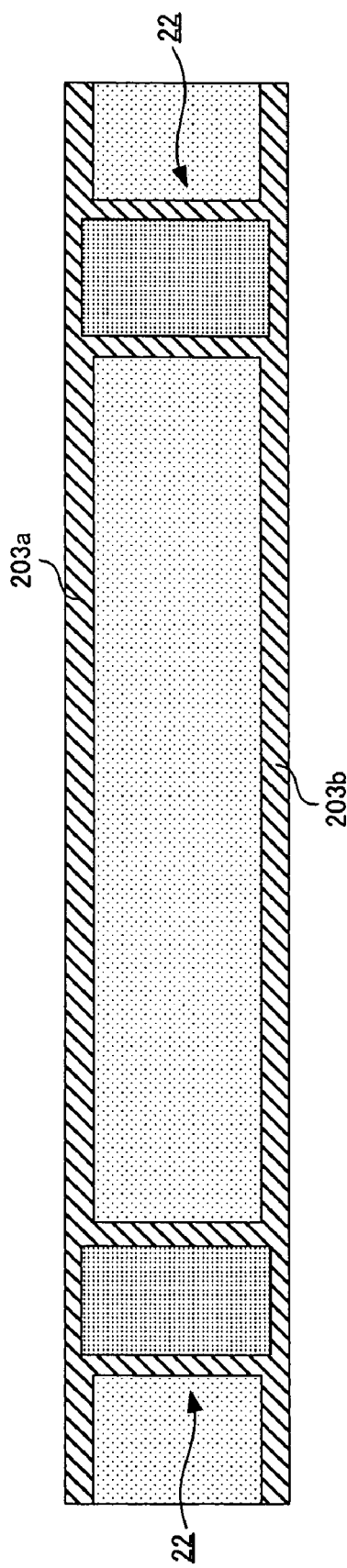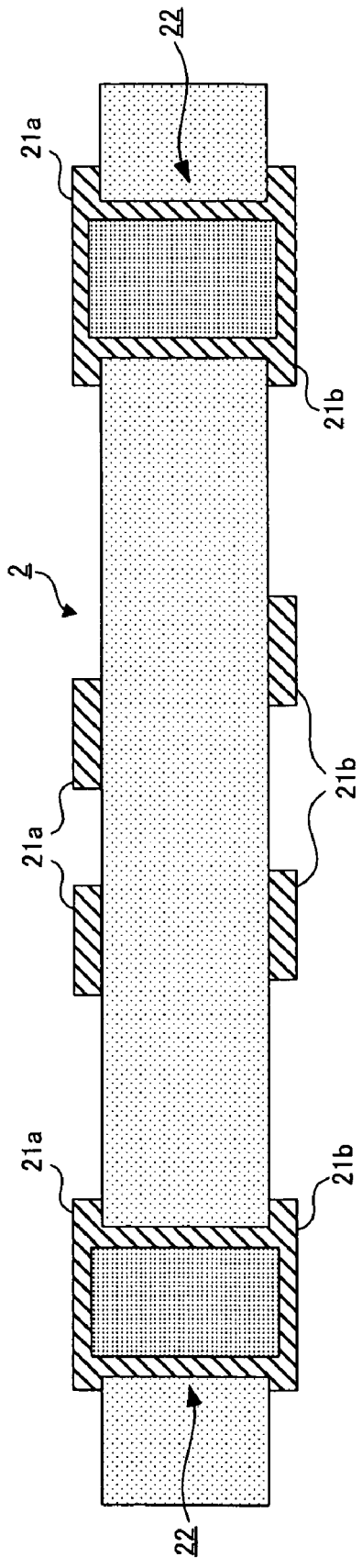

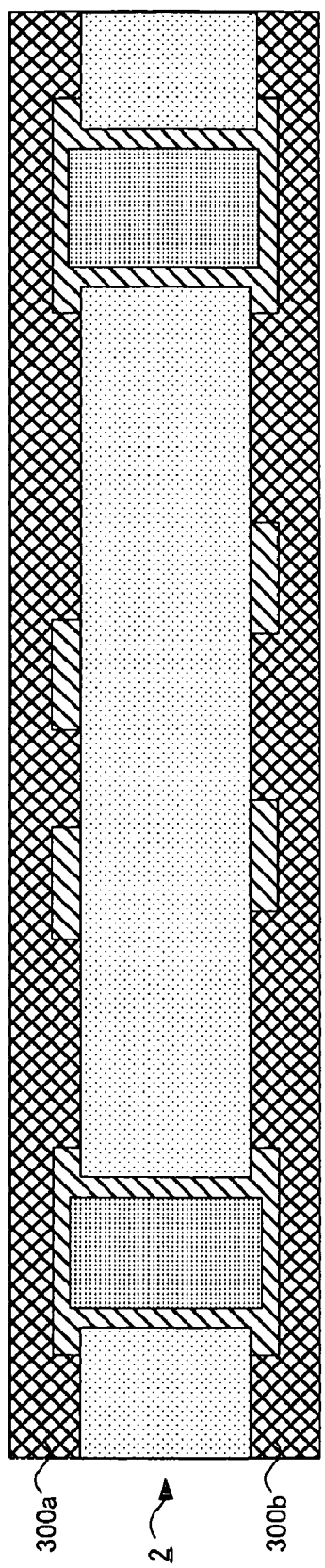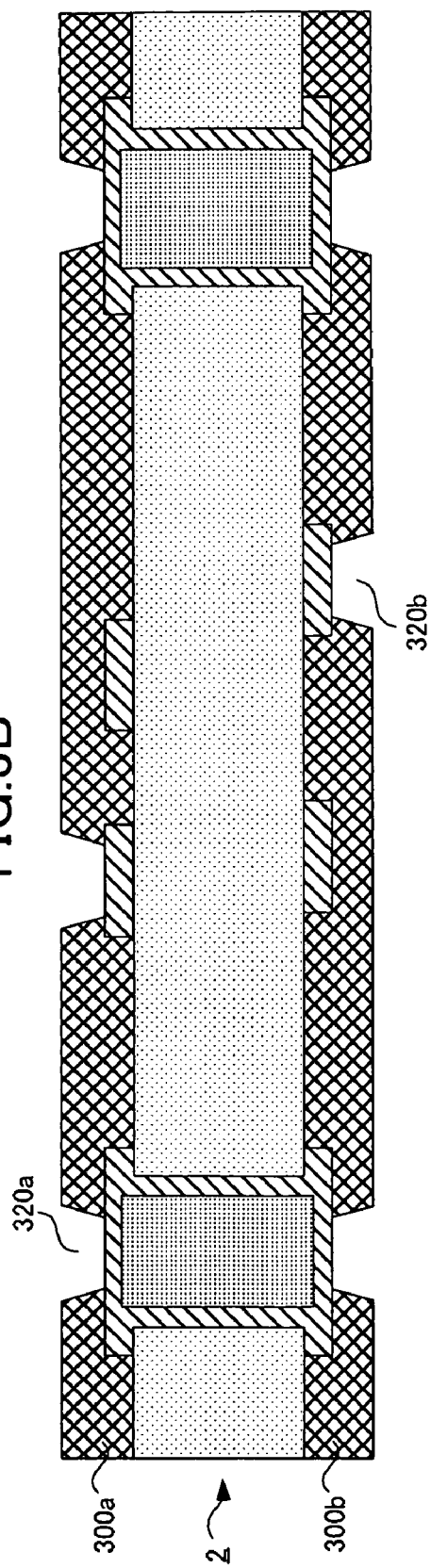

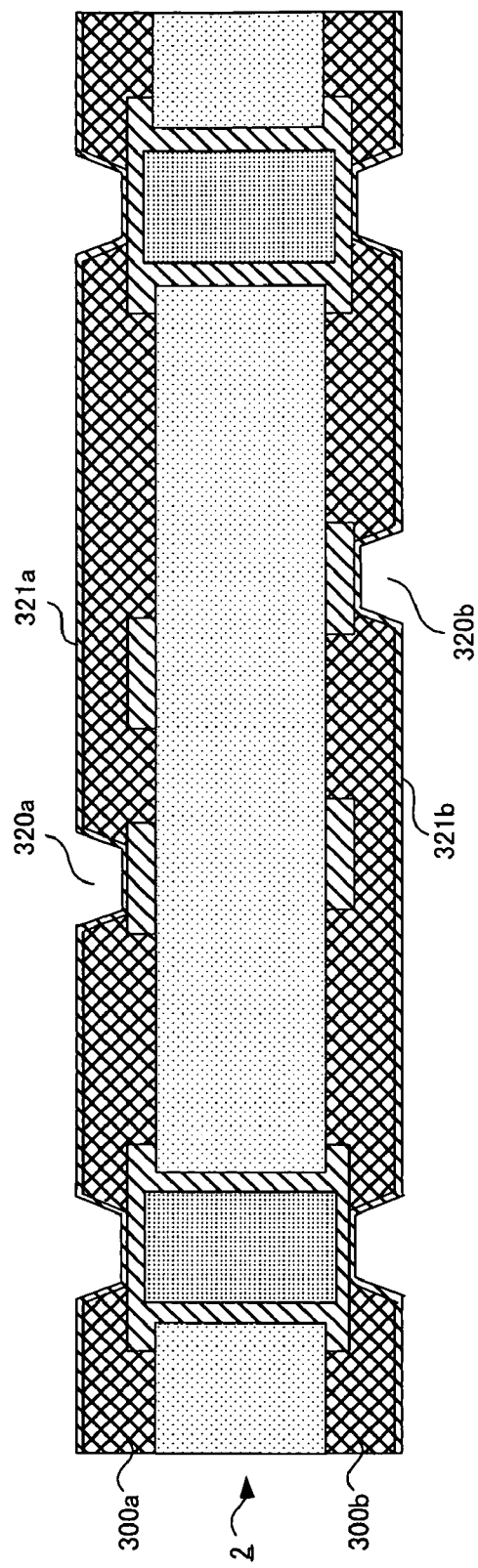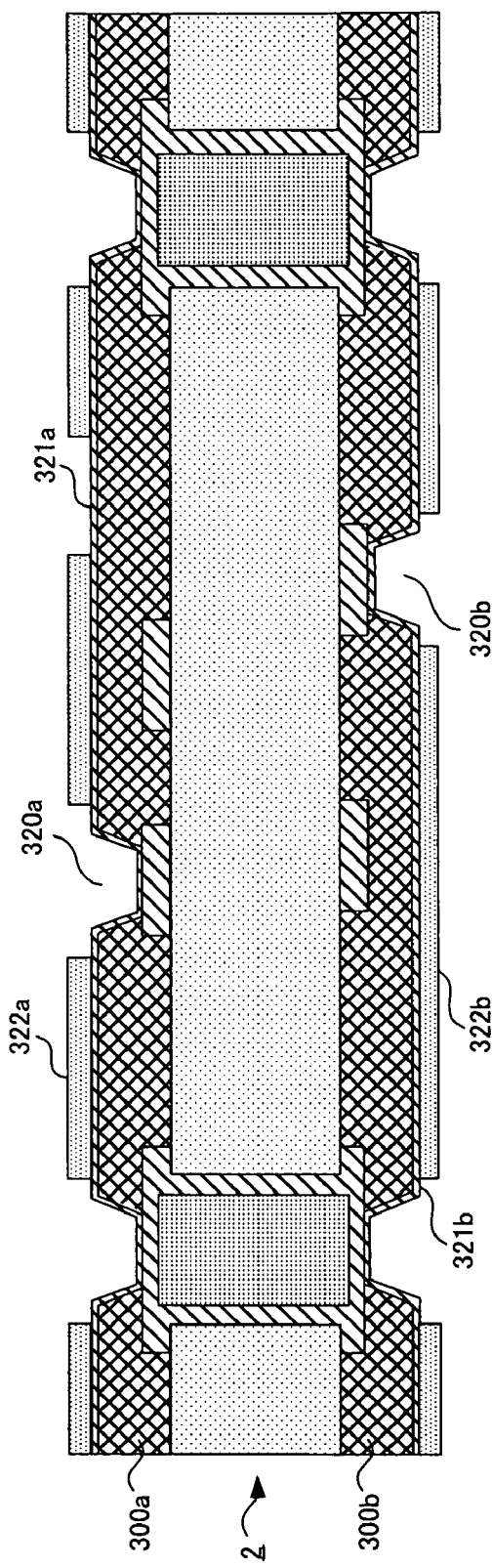

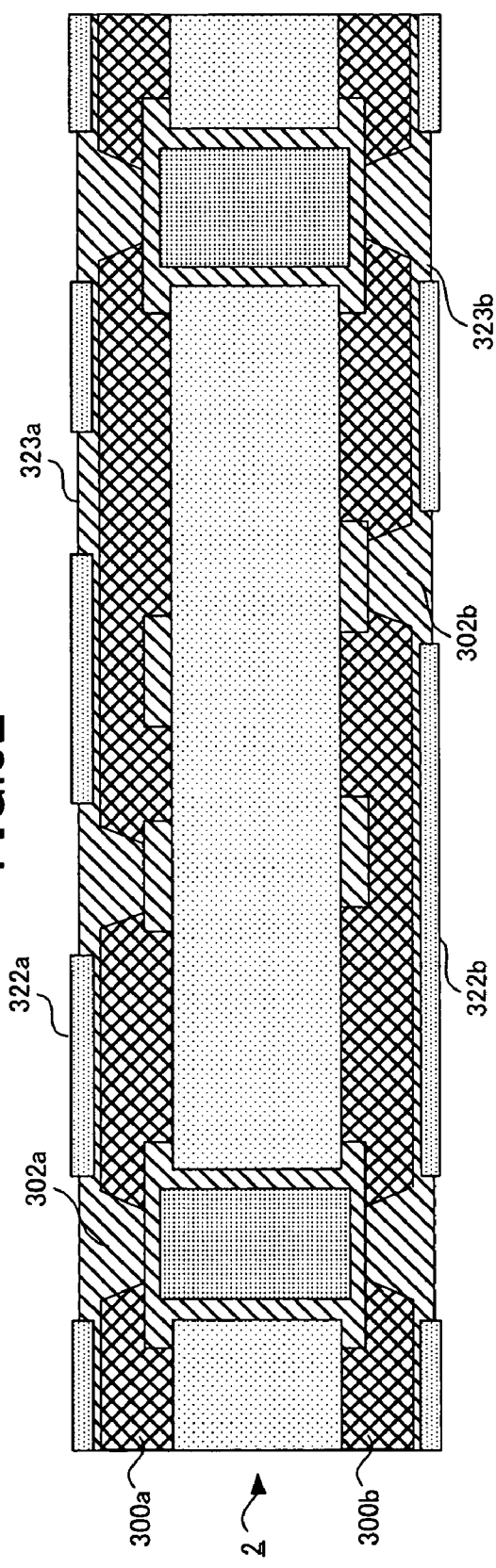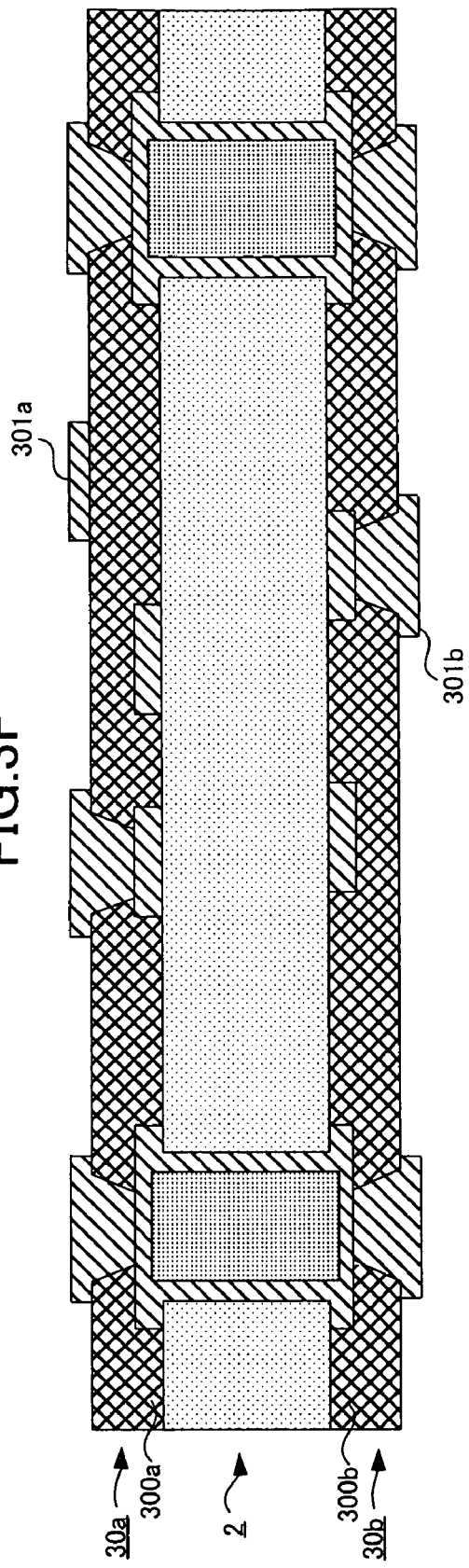

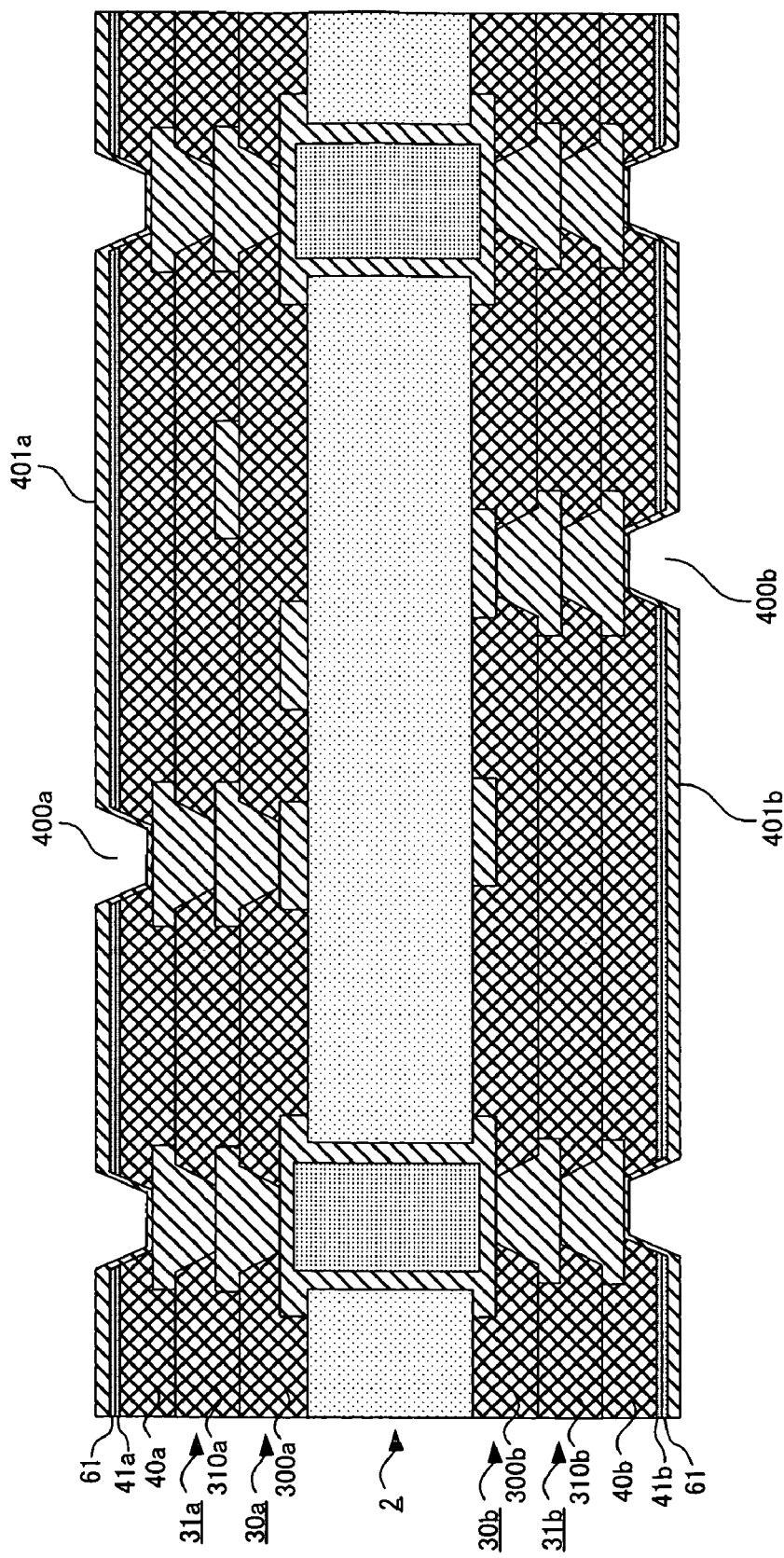

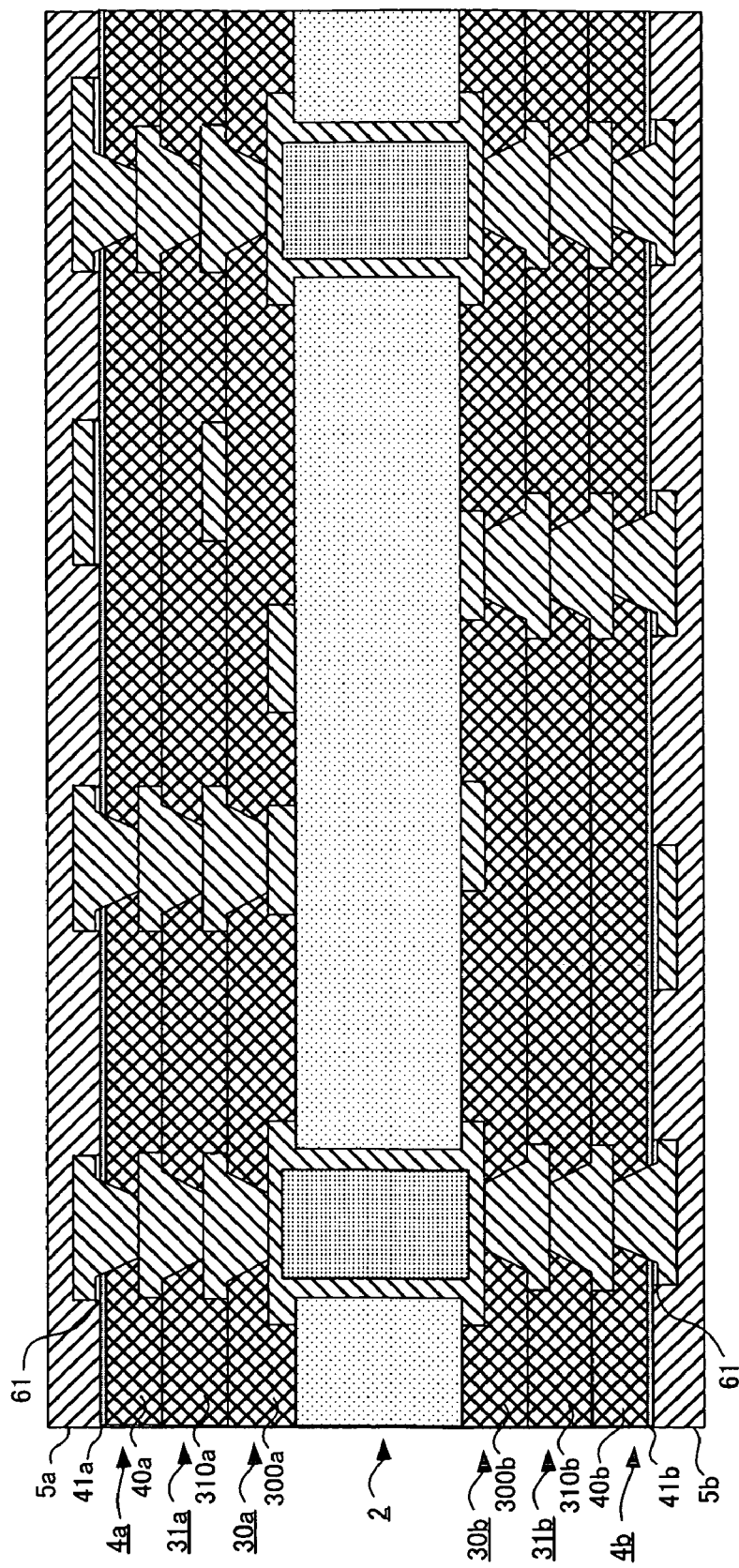

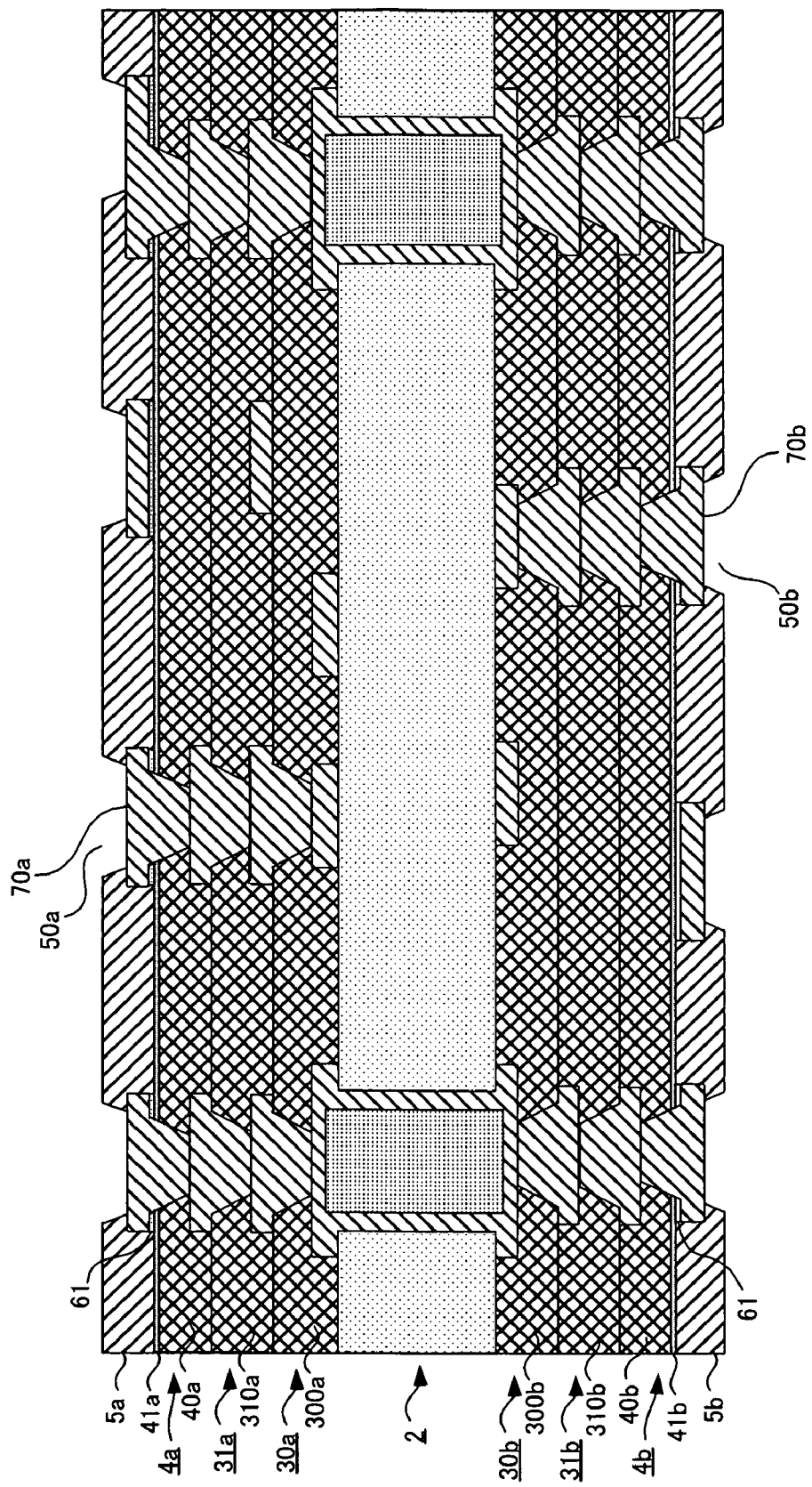

PRINTED WIRING BOARD WITH RESIN COMPLEX LAYER AND MANUFACTURING METHOD THEREOF

CROSS-REFERENCE TO RELATED APPLICATIONS

This patent application claims the benefit of U.S. Provisional Patent Application No. 61/038,473, filed Mar. 21, 2008, which is incorporated by reference.

BACKGROUND OF THE INVENTION

In recent years, electronic devices have become highly functional and more compact, and thus highly-integrated printed wiring boards are desired. A high-density printed wiring board can be obtained by a build-up method in which multiple layers are laminated on a substrate. Also, a printed wiring board with sufficient tolerance to external stresses (such as heat, vibration impact and drop impact) is desirable. In particular, sufficient reliability against major stresses is preferred so that a printed wiring board is mounted on an electronic device for use in severe environments such as electronic equipment for automobiles and cell phones. If, for example, joint strength (shear strength) is insufficient between pads on the wiring board and terminals of a component (such as an IC chip), the joints may break, or the component may be displaced when large external stresses are exerted thereon. Therefore, a printed wiring board with sufficient tolerance to external stress and high shear strength is desired.

BRIEF SUMMARY OF THE INVENTION

In one aspect, the invention provides a method of manufacturing a multilayer printed wiring board in which a core substrate is provided, an insulation layer including a thermosetting resin material is formed over the core substrate, an uncured resin layer including a thermoplastic resin material is placed on the insulation layer, the uncured resin layer is cured to form a resin complex layer including a resin complex comprising the thermosetting resin material and the thermoplastic resin material, and a conductive circuit is formed over the resin complex layer.

In another aspect, the invention provides a multilayer printed wiring board having a core substrate, an insulation layer formed over the core substrate, a resin complex layer formed on the insulation layer, and a conductive circuit formed over the resin complex layer. The resin complex layer includes a resin complex comprising a thermosetting resin material and a thermoplastic resin material. The conductive circuit has a pad portion for connection to an electronic part.

BRIEF DESCRIPTION OF THE SEVERAL VIEWS OF THE DRAWING(S)

FIGS. 2A-2F are cross-sectional views of a multilayer printed wiring board being manufactured by a method according to one embodiment of the present invention.

FIGS. 3A-3G are cross-sectional views of the multilayer printed wiring board being manufactured by the method according to one embodiment of the present invention.

FIGS. 4A-4G are cross-sectional views of the multilayer printed wiring board being manufactured by the method according to one embodiment of the present invention.

FIGS. 5A and 5B are cross-sectional views of the multilayer printed wiring board being manufactured by the method according to one embodiment of the present invention.

DETAILED DESCRIPTION OF THE INVENTION

Figure 1:
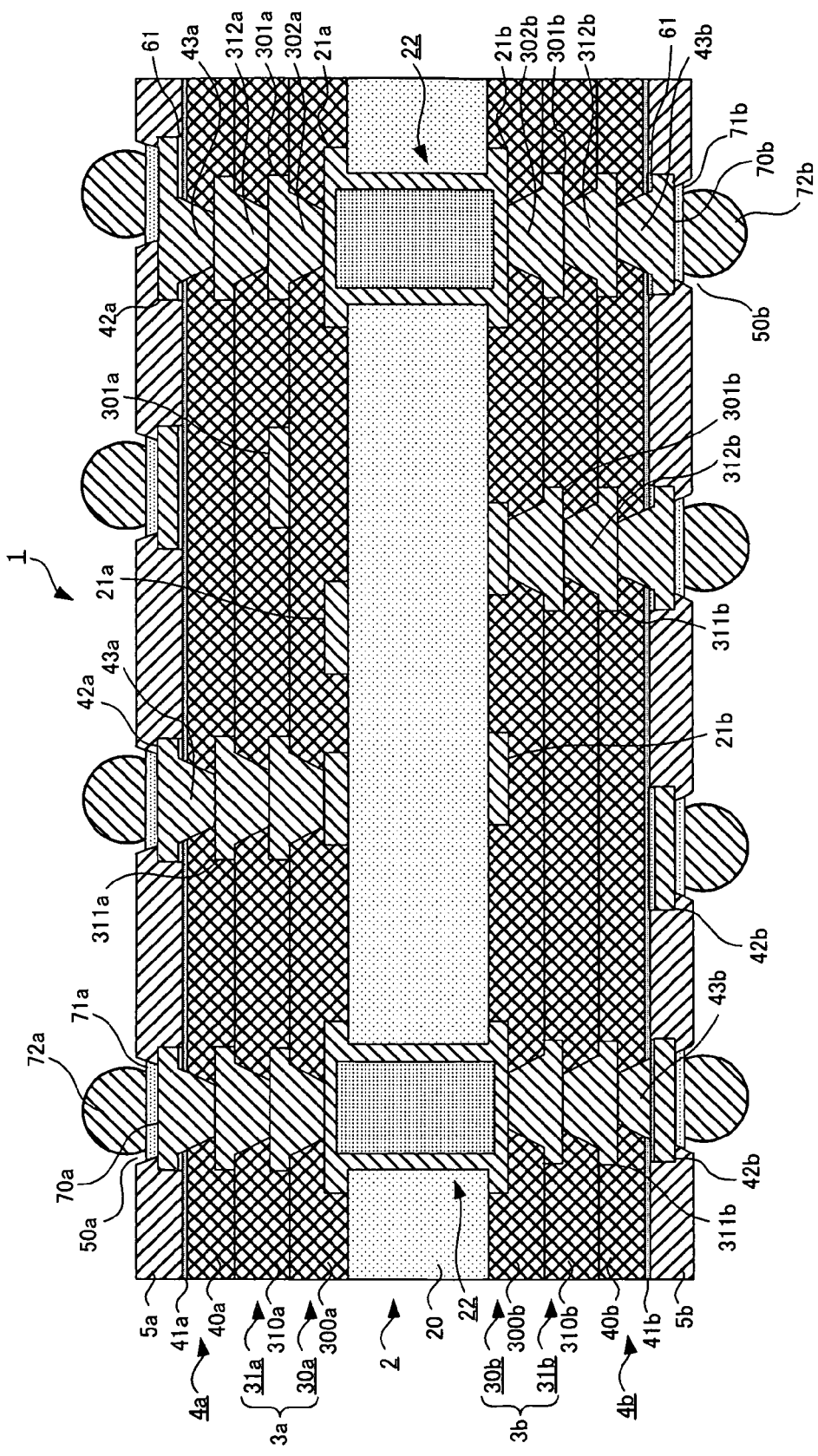
FIG. 1 is a cross-sectional view of a multilayer printed wiring board according to one embodiment of the present invention.

FIG. 1 is a cross-sectional view schematically showing a multilayer printed wiring board 1 according to one embodiment of the present invention. In the illustrated embodiment, the multilayer printed wiring board 1 has a core substrate 2 and multi-layered structures on top and bottom surfaces of the core substrate 2. Hereinafter, the bottom surface of a layer or a substrate in the drawing is referred to as the first surface, and the top surface of the layer or the substrate is referred to as the second surface. A build-up layer structure (3a) and a surface layer structure (4a) are placed over a second surface of the core substrate 2. The build-up layer structure (3a) is comprised of a first layer (30a) and a second layer (31a). The surface layer structure (4a) has an insulation layer (40a), a resin complex layer (41a) and a conductive circuit (42a). A solder resist layer (5a) is formed over the surface layer structure (4a). In the solder resist layer (5a), multiple opening portions (50a) are provided to form solder bumps (72a) in the opening portions (50a). The multilayer printed wiring board 1 is electrically connected to electronic components such as an IC chip through the solder bumps (72a). On the first surface of the core substrate 2, a build-up layer structure (3b), a surface layer structure (4b), and a solder resist layer (5b) are formed in this order in the illustrated embodiment. The build-up layer structure (3b) is comprised of a first layer (30b) and a second layer (31b). The surface layer structure (4b) has an insulation layer (40b), a resin complex layer (41b) and a conductive circuit (42b). In the solder resist layer (5b), opening portions (50b) are provided to form solder bumps (72b) and establish an electrical connection with components such as an IC chip mounted on the multilayer printed wiring board 1.

The core substrate 2 has an insulation substrate 20 and conductive circuits (21a, 21b) formed on the insulation substrate 20. The insulation substrate 20 can be a board made by, for example, impregnating a base material such as glass cloth with an epoxy-type resin or the like. The insulation substrate 20 can have a thickness in the range of, for example, about 60 to about 600 μm. Conductive circuits (21a, 21b) are comprised of a conductive material such as copper. The thickness of conductive circuits (21a, 21b) is preferably in the range of, for example, about 5 to about 25 μm. The conductive circuit (21a) and the conductive circuit (21b) are electrically connected by through-hole conductors 22 penetrating the insulation substrate 20.

In the illustrated embodiment, the build-up layer structure (3a, 3b) includes a first layer (30a, 30b) and a second layer (31a, 31b). The first layer (30a, 30b) is comprised of an insulation layer (300a, 300b) and a conductive circuit (301a, 301b). The insulation layer (300a, 300b) includes insulative material such as epoxy resin, BT (bismaleimide triazine) resin, polyimide resin or the like. The thickness of the insulation layer (300a, 300b) can be in the range of, for example, about 20 to about 100 µm. The conductive circuit (301a) is formed on the second (top) surface of the insulation layer (300a), and conductive circuit (301b) is formed on the first (bottom) surface of the insulation layer (300b). The conductive circuit (301a, 301b) is comprised of a conductive material such as copper, and the thickness is preferably in the range of about 5 to about 25 µm. The conductive circuit (301a, 301b) and conductive circuit (21a, 21b) are electrically connected by via conductors (302a, 302b). The via conductors (302a, 302b) are filled vias having via holes filled by plating such as copper plating. Plating can be, for example, electroless plating or electrolytic plating.

The second layer (31a, 31b) is comprised of an insulation layer (310a, 310b) and a conductive circuit (311a, 311b). If desired, the insulation layer (310a, 310b) can have the same material and/or thickness as those of the insulation layer (300a, 300b). The conductive circuit (311a) is formed on the second (top) surface of the insulation layer (310a), and conductive circuit (311b) is formed on the first (bottom) surface of the insulation layer (310b). The conductive circuit (311a, 311b) can have the same material and/or thickness as those of the conductive circuit (301a, 301b), if desired. The conductive circuit (311a, 311b) and conductive circuit (301a, 301b) are electrically connected by the via conductors (312a, 312b), which are filled vias.

In the illustrated embodiment, the surface layer structure (4a, 4b) is comprised of an insulation layer (40a, 40b), a resin complex layer (41a, 41b) and a conductive circuit (42a, 42b). The insulation layer (40a, 40b) can have the same material and thickness as those of the insulation layer (310a, 310b). The resin complex layer (41a, 41b) formed over the insulation layer (40a, 40b) includes a resin complex comprised of a thermosetting resin material and a thermoplastic resin material as described below in more detail. The thickness of the resin complex layer (41a, 41b) is preferably in the range of about 2 µm to about 4 µm. The conductive circuit (42a, 42b) formed over the resin complex layer (41a, 41b) includes a conductive material such as copper, and preferably has a thickness in the range of about 5 to about 25 µm. The conductive circuit (42a, 42b) and the conductive circuit (311a, 311b) are electrically connected by via conductors (43a, 43b), which are filled vias in the present embodiment. The conductive circuit (42a, 42b) is formed to have a pad portion (70a, 70b) for connection to an electronic component. Multiple opening portions (50a, 50b) are formed in the solder resist layer (5a, 5b) to expose the pad portions (70a, 70b) of the conductive circuit (42a, 42b). On the pad portions (70a, 70b), a solder joint layer (71a, 71b) is formed to enhance solderability, and solder bumps (72a, 72b) are formed on the solder joint layer (71a, 71b). Multilayer printed wiring board 1 is electrically connected to electronic components such as an IC chip through the solder bumps (72a, 72b).

Figure 8:
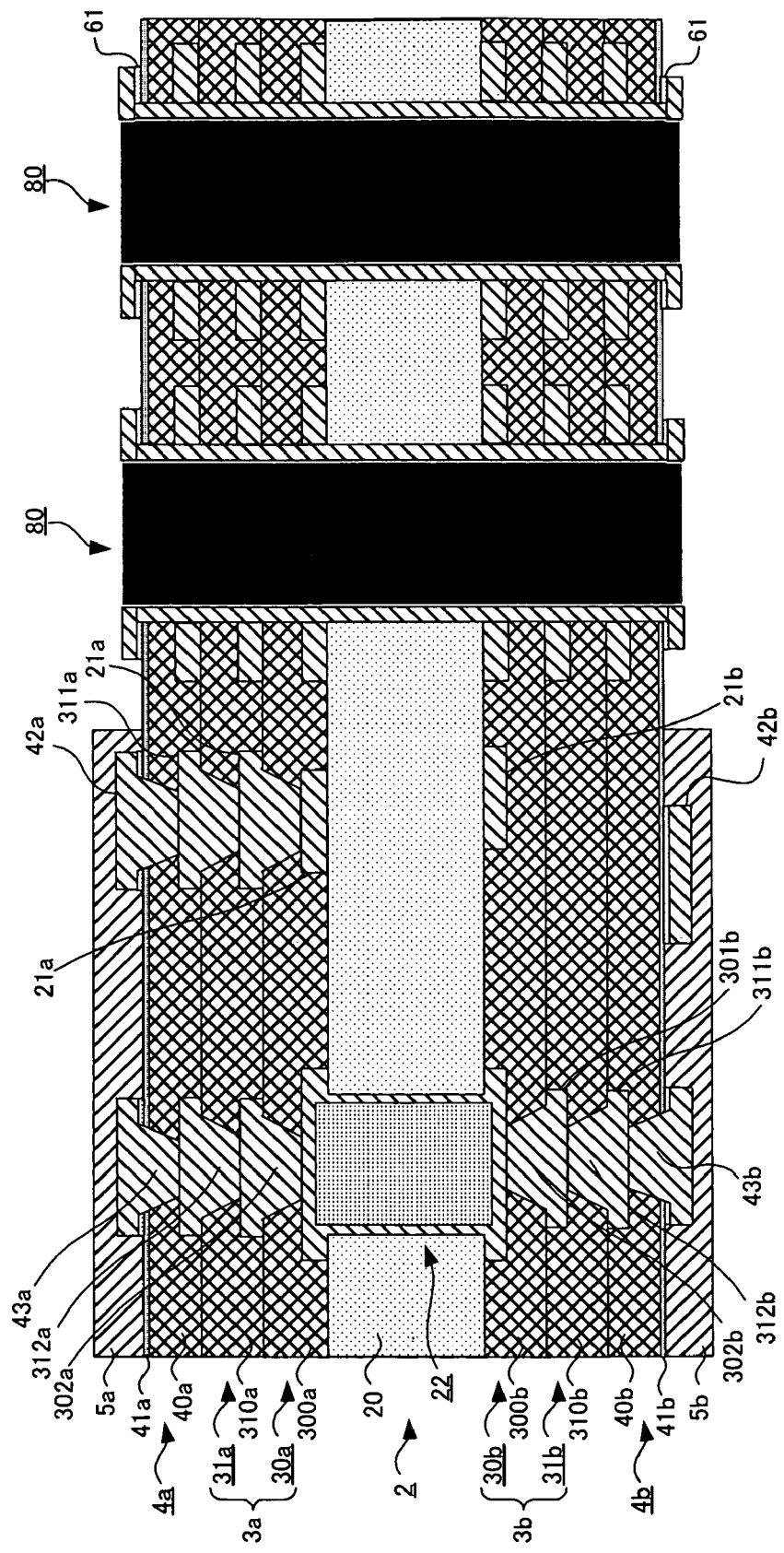
FIG. 8 is a cross-sectional view of a multilayer printed wiring board according to another embodiment of the present invention.

FIG. 8 is a cross-sectional view of a multilayer printed wiring board according to another embodiment of the present invention. The members described in the previous embodiment are referred to by the same numbers. Instead of having solder balls for electrical connection with an electronic component, a multilayer printed wiring board can have through-holes 80 that entirely penetrate the wiring board as shown in FIG. 8. The wiring board having the through-holes 80 can be electrically connected to a terminal-insertion type component.

With reference to FIG. 2A to FIG. 7, a method for manufacturing a multilayer printed wiring board according to one embodiment of the present invention is described.

(1) Core Substrate 2

FIG. 2A shows a cross section of a base substrate 200. The base substrate 200 can be produced by, for example, laminating metal films (201a, 201b) on an insulation substrate 20. The metal film (201a, 201b) can have a thickness in the range of, for example, about 5 µm to about 30 µm. In one example, the metal film (201a, 201b) has a thickness of about 25 µm. The insulation substrate 20 can have a thickness in the range of, for example, about 60 µm to about 600 µm. One example of the base substrate 200 is a copper-clad laminate produced by laminating copper foils on both surfaces of an insulative substrate. As for the insulation substrate 20, a variety of resin materials including a flame-retardant glass base epoxy-resin laminate with an FR (Flame Retardant) grade of 4 (FR-4) can be used. Also, the insulation substrate 20 can be a rigid sheet material such as glass cloth impregnated with BT resin, polyphenylene ether resin or the like, or aramid non-woven fabric impregnated with epoxy resin, polyimide resin or the like.

In the base substrate 200 (FIG. 2A), through holes 202 that penetrate the metal films (201a, 201b) and the insulation substrate 20 are formed (see FIG. 2B). The through holes 202 can be formed by, for instance, boring by a drilling method using a drill or the like.

Figure 2C:
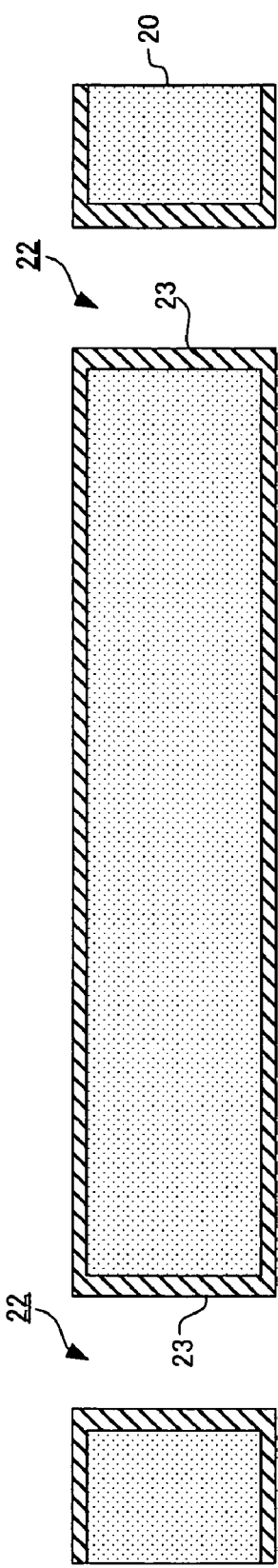

Subsequently, an inner-hole conductive layer 23 forming a through-hole conductor 22 is formed (see FIG. 2C). The conductive material such as copper is plated to form the inner-hole conductive layer 23. For example, electroless copper plating and electrolytic copper plating can be used. The same conductive material as the inner-hole conductive layer 23 is plated on the surfaces of the based substrate 200 (see FIG. 2A).

Figure 2D:
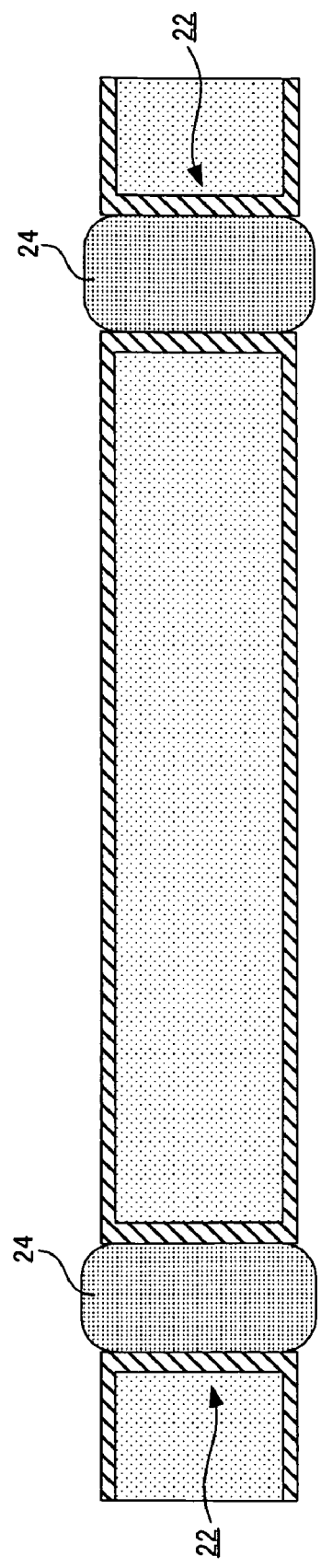

In the space of the through-hole conductor 22, a filling agent 24 (FIG. 2D) is provided. The filling agent 24 is then dried and cured. In one example, the filling agent 24 includes, a bisphenol-F based epoxy resin and inorganic particle such as silica or alumina. In another example, the filing agent 24 includes metallic particles and a resin. The filling agent 24 can be provided by, for example, screen printing. As shown in FIG. 2D, some of the filling agent 24 may protrude from the surfaces of the base substrate 200 (see FIG. 2A). In that case, the surfaces of the base substrate 200 are polished over the plated conductive material to remove the filling agent 24 protruding from the surfaces and make the surfaces substantially flat. Subsequently, conductive layers (203a, 203b) are formed (see FIG. 2E) by, for example, plating such as electroless copper plating and electrolytic copper plating. The conductive layers (203a, 203b) are patterned to form conductive circuits (21a, 21b) by, for example, using a tenting method. The core substrate 2 is produced as shown in FIG. 2F.

(2) Build-Up Layer Structures (3a, 3b)

Insulation layers (300a, 300b)

Insulation layers (300a, 300b) are formed over the first and second surfaces of the core substrate 2 (see FIG. 3A). One example of methods for forming the insulation layer (300a, 300b) is to laminate a film comprised of a thermosetting resin on the surface of the core substrate 2 and thermopress the film. Another example is to coat a liquid thermosetting resin by using a screen printing method or a curtain coating method. After forming the insulation layer (300a, 300b), laser vias (320a, 320b) (blind holes) are formed in the insulation layer (300a, 300b) as shown in FIG. 3B by using, for instance, a laser such as a carbon dioxide ($CO_2$) gas laser, UV-YAG laser or the like.

The core substrate 2 is subjected to a treatment (desmear treatment) to remove smears or the like remaining on the bottom of the laser via (320a, 320b). The treatment removes the smears and at the same time roughens the surfaces of the insulation layers (300a, 300b). The surface roughness can have a height of, for example, about 1.0 μm to about 5.0 μm. The desmear treatment can be conducted by, for example, using an oxidizer such as permanganate. For example, the treatment using permanganate can be conducted as follows. After conducting a conditioning treatment (resin swelling), the core substrate 2 is immersed in a desmear treatment solution containing permanganate 40-80 g/l at temperatures of 50-80° C. for 5-20 minutes. Then, the core substrate 2 is washed with water, immersed in a neutralizer solution, washed with water, and dried.

After the desmear treatment, the core substrate 2 with the insulation layers (300a, 300b) formed thereon can be immersed in a catalytic solution containing, for example, tin-palladium complex salt (or colloid) so that the catalyst for starting electroless copper plating is adhered on the surfaces of the insulation layers (300a, 300b).

Subsequently, electroless plated films (321a, 321b) (FIG. 3C) are formed on the surfaces of the insulation layers (300a, 300b) with the catalyst attached thereto. The electroless plated films (321a, 321b) can be formed by, for example, immersing the core substrate 2 with the insulation layers (300a, 300b) in an electroless copper plating solution. The electroless plated films (321a, 321b) can have a thickness in the range of, for example, about 0.1 μm to about 1.0 μm. In one example, the electroless plated films (321a, 321b) have a thickness of approximately 0.2 μm.

The surfaces of the insulation layers (300a, 300b) have roughened portions produced by the treatment using an oxidizer such as an oxidation solution containing permanganate. Through the anchoring effect of the roughened portions, the insulation layer (300a, 300b) and electroless plated film (321a, 321b) are more firmly adhered to each other.

Subsequently, a photosensitive dry-film resist is laminated on the surfaces of the electroless plated films (321a, 321b). A mask film with a predetermined pattern is adhered to each photosensitive resist, which is exposed to ultraviolet rays and developed with, for example, an alkaline solution. As a result, plating resist layers (322a, 322b) (FIG. 3D) are formed with openings where via conductors are to be formed.

After washing with water and drying, electrolytic plating such as electrolytic copper plating is conducted to form electrolytic plated layers (323a, 323b) (FIG. 3E) in the openings of the plating resist layers (322a, 322b). The plating material is also filled into the laser vias (320a, 320b) to form via conductors (302a, 302b). The thickness of the electrolytic plated layer (323a, 323b) can be, for example, about 5 to about 35 μm.

After removing the plating resist layers (322a, 322b), washing with water, and drying, the exposed portions of the electroless plated film (321a, 321b) are removed by, for example, etching. The first layers (30a, 30b) having the conductive circuits (301a, 301b) patterned on the surfaces of the insulation layers (300a, 300b) are produced (see FIG. 3F).

Figure 3G:
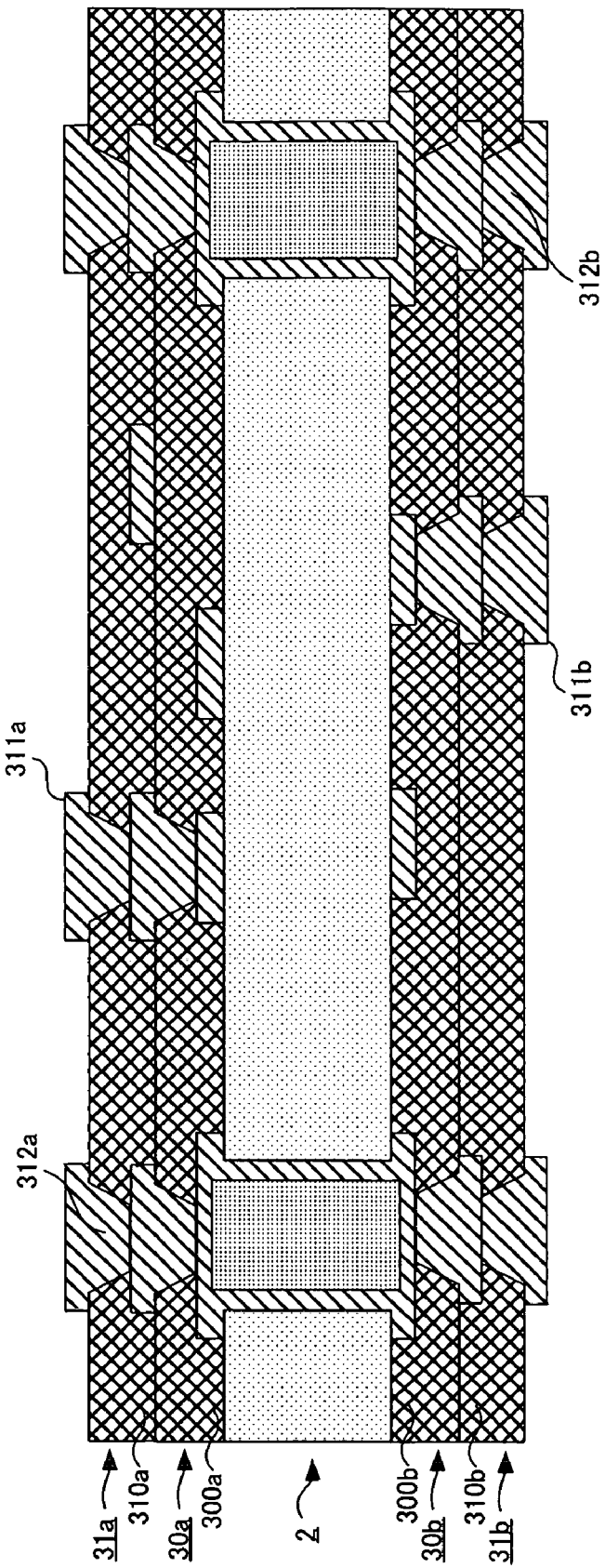

The above processes are repeated to form second layers (31a, 31b) having the conductive circuits (311a, 311b) patterned on the surfaces of the insulation layers (310a, 310b) are obtained (see FIG. 3G). Via conductors (312a, 312b) are formed in the second layers (31a, 31b).

(3) Surface Layer Structures (4a, 4b)

(3-1) Insulation Layers (40a, 40b)

Figure 4A:
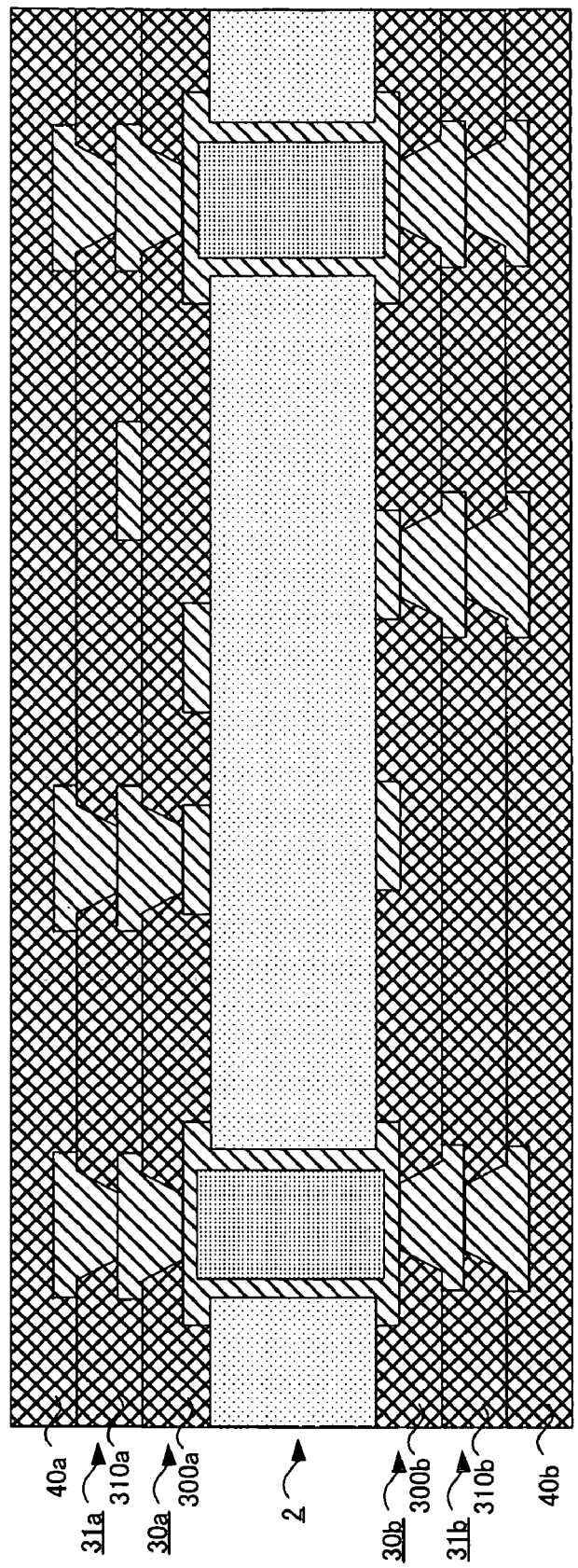

Insulation layers (40a, 40b) are formed on the surfaces of the insulation layers (310a, 310b) as shown in FIG. 4A. The insulation layers (40a, 40b) can be formed by, for example, placing a film containing a thermosetting resin on the surface of the insulation layer (310a, 310b), and thermopressing the film. Alternatively, a liquid thermosetting resin can be coated by methods such as a screen printing method or a curtain coating method to form the insulation layers (40a, 40b). The thermosetting resin used for forming the insulation layers (300a, 300b, 310a, 310b) can be used to form the insulation layers (40a, 40b), if desired.

(3-2) Resin Complex Layers (41a, 41b), Adhesion Support Layers 61 and Metallic Films 62

Figure 4B:
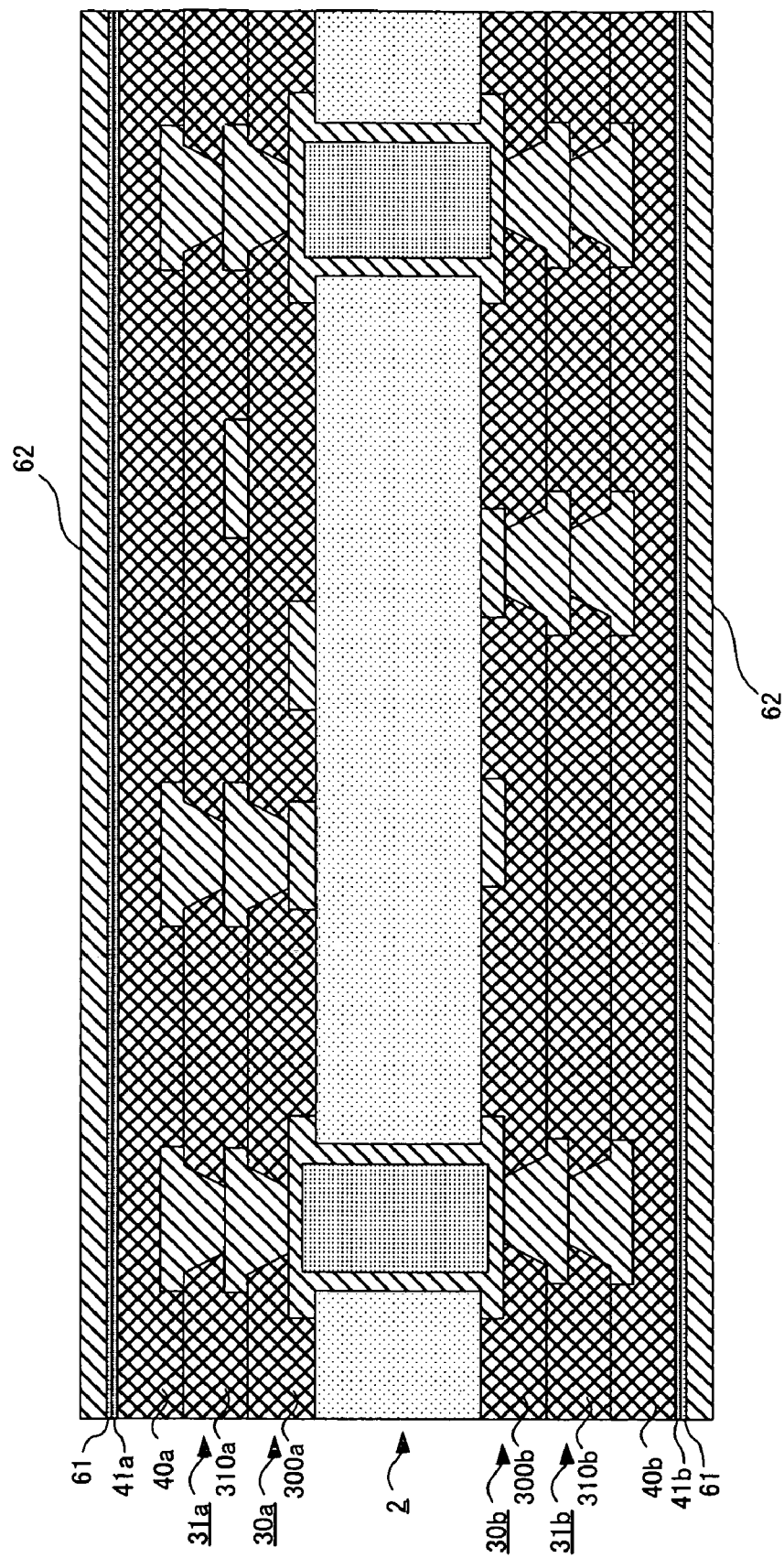
Figure 4C:
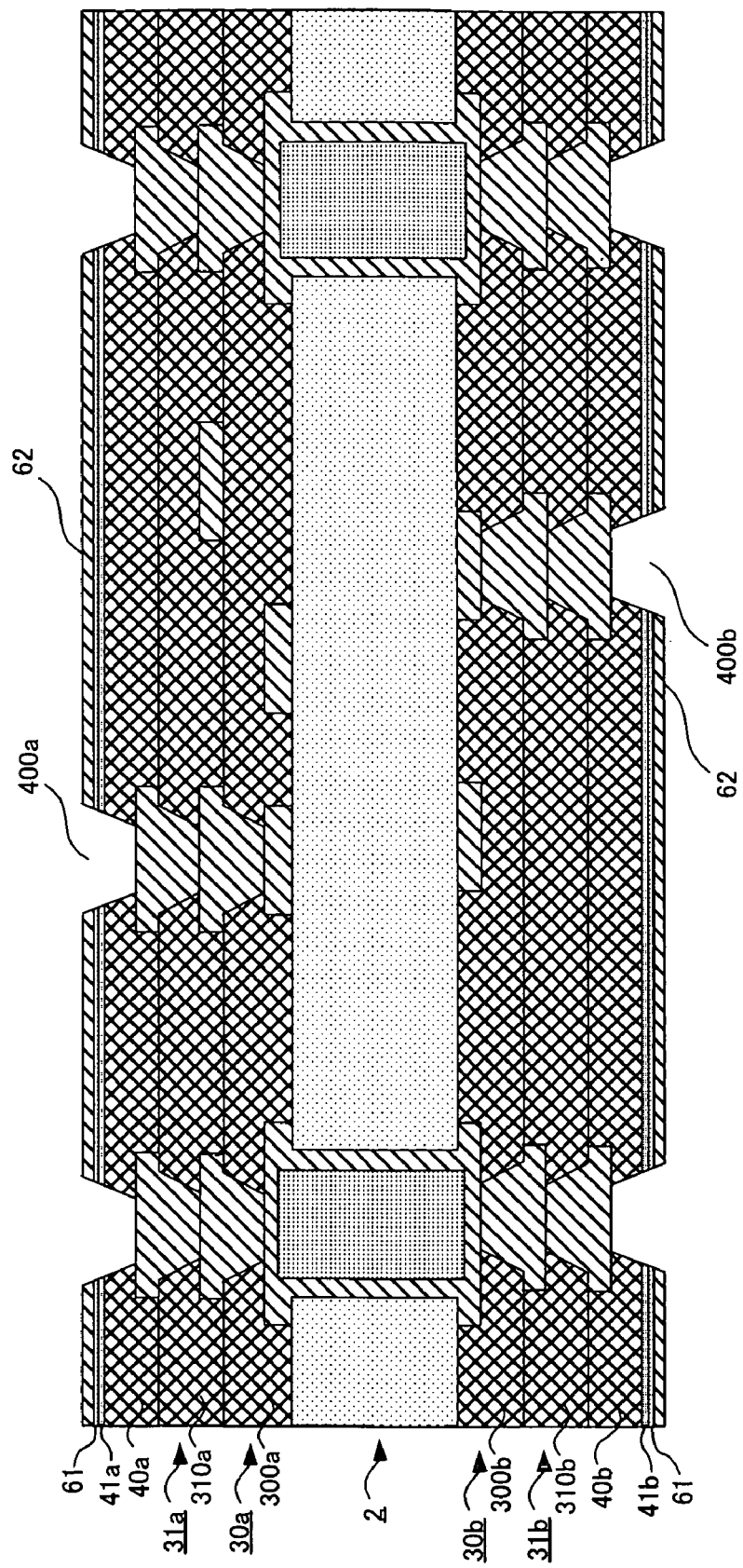
Figure 4E:
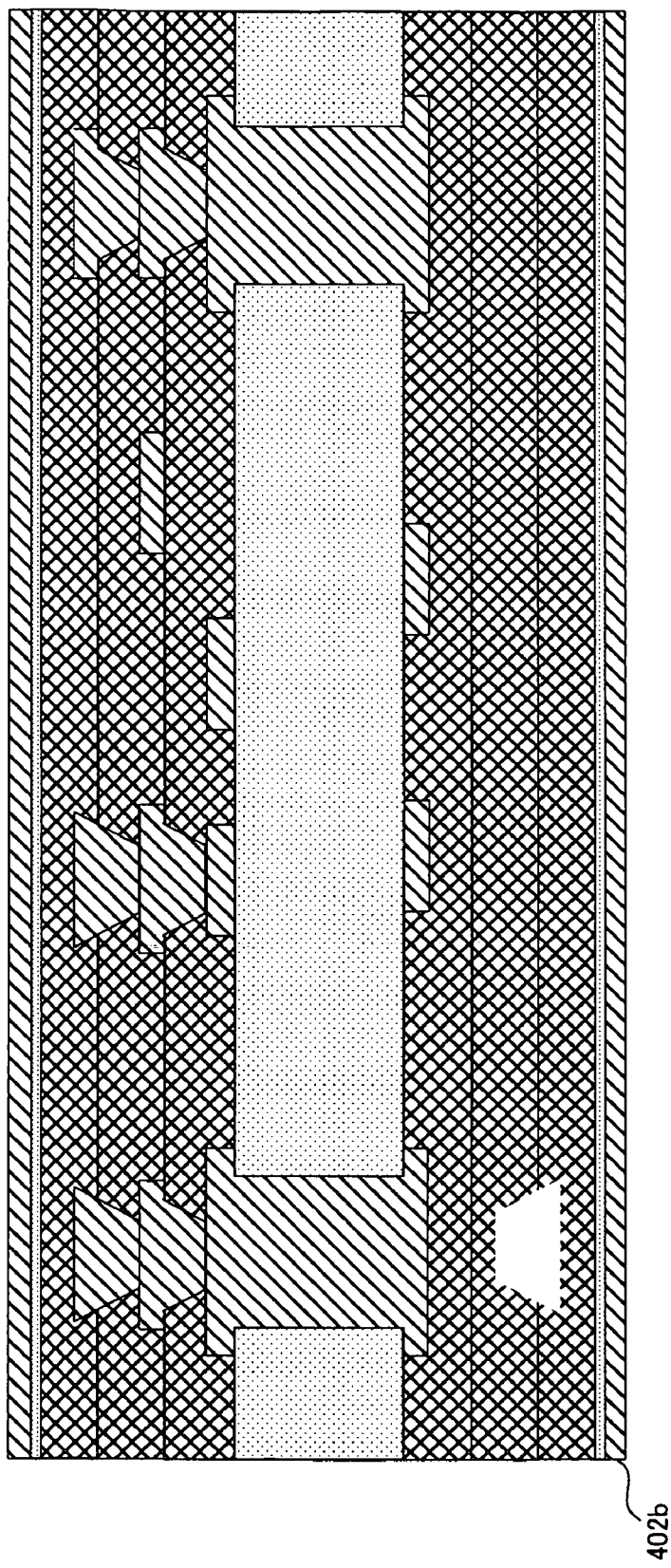

The resin complex layers (41a, 41b), adhesion support layers 61, and metallic films 62 are formed over the insulation layers (40a, 40b) as shown in FIG. 4B. The resin complex layers (41a, 41b) include a resin complex of a thermosetting resin material and a thermoplastic resin material. As for the thermosetting resin material, epoxy resin, phenolic resin, polyimide resin or the like can be used alone or in combination. As for the thermoplastic resin material, polyethersulfone (PES) resin, phenoxy resin, fluoride resin, polyetherketone resin, aromatic polyamide resin or the like can be used alone or in combination. The resin complex layers (41a, 41b) may include one or more thermosetting resins and one or more thermoplastic resins. The resin complex in the resin complex layers (41a, 41b) desirably contains about 20 to about 80 weight parts of the thermosetting resin material and about 80 to about 20 weight parts of the thermoplastic resin material. The metallic film 62 can be, for example, a copper foil.

The resin complex layers (41a, 41b), adhesion support layer 61, and metallic films 62 can be formed by, for example, placing a multi-layered film 6 (FIG. 7) on the surface of the insulation layer (40a, 40b) and thermopressing the multi-layered film 6. For example, thermopressing can be performed at a temperature of about 130° C. by applying a pressure of about 1.0 MPa for about 10 seconds. In the embodiment illustrated in FIG. 7, the multi-layered film 6 has a resin layer 60, the adhesion support layer 61, and the metallic film 62. The adhesion support layer 61 is utilized to enhance the affinity (adhesiveness) between the resin layer 60 and the metallic film 62. It is preferred that the adhesion support layer 61 contains a metal different from the metallic film 62. For example, the adhesion support layer 61 is preferred to contain one or more materials among zinc, nickel and chrome.

The thickness of the resin layer 60 can be in the range of, for example, about 2 μm to about 4 μm. The thickness of the adhesion support layer 61 and metallic film 62 can be about 3 μm and about 30 μm, respectively. One example of the multi-layered film 6 is a three-layered material comprised of a copper foil, a layer of zinc, nickel or chrome, and a resin layer containing a thermoplastic resin. The multi-layered film 6 can be produced by, for example, forming the adhesion support layer 61 (by, for example, sputtering) on the resin layer 60, and laminating and adhering the metallic film 62 onto the adhesion support layer 61.

The resin layer 60 is an uncured resin layer containing a thermoplastic resin. It is preferable that the resin layer 60 prior to being thermopressed onto the insulation layer (40a, 40b) does not contain a thermosetting ingredient or a curing agent, and instead receives a thermosetting ingredient or a curing agent from the insulation layer (40a, 40b) while the resin layer 60 is cured. That is, after the resin layer 60 along with the metallic film 62 and the adhesion support layer 61 is placed on the insulation layer (40a, 40b) and cured by thermopressing, at least some of thermosetting ingredients flow from the insulation layer (40a, 40b) into the resin layer 60 which is in contact with the insulation layer (40a, 40b). As such, the thermosetting resin material in the insulation layer (40a, 40b) and the thermoplastic resin in the resin layer 60 react with each other to form a resin complex. The term "resin complex" is utilized herein to refer to a mixture of one or more thermoplastic resins and one or more thermosetting resins, where at least some of the thermoplastic resin(s) and at least some of the thermosetting resin(s) are chemically bonded to one another. While not wishing to be bound to any particular theory or mechanism, it is believed that a resin complex is formed by a chemical reaction that occurs at the interface between the insulation layer (41a, 41b) and the resin layer 60, and that a part of the functional group of the thermosetting resin or a thermosetting moiety becomes chemically bonded with a thermoplastic resin contained in the resin layer 60 to form a resin complex having a thermosetting moiety and a thermoplastic moiety. In the reaction, the resin layer 60 is believed to receive at least some of the thermosetting ingredients from the insulation layer (41a, 41b), and the extent of chemical reaction depends on various factors including the type of resins and conditions of the thermopress. Due to the chemical bonding, the resin complex layers (41a, 41b) are more firmly adhered to the insulation layers (40a, 40b). The resin complex layers (41a, 41b) containing a resin complex including a thermosetting resin and a thermoplastic resin are more viscous and have a higher tensile strength. If desired, the resin layer 60 before being thermopressed onto the insulation layer (40a, 40b) may contain a thermosetting ingredient or a curing agent in addition to the thermosetting ingredient received from the insulation layer (40a, 40b) during the curing process.

Subsequently, the metallic film 62 is removed by using, for example, a half-etching method to reduce the thickness to a desired range. Preferably, the thickness is adjusted to be in the range of about 5 to about 35 μm. Thereafter, using a laser such as a carbon dioxide gas ($CO_2$) laser, UV-YAG laser or the like, a hole is formed in the metallic film 62, the resin complex layer (41a, 41b) and the insulation layer (40a, 40b) to form laser vias (blind holes) (400a, 400b) (see FIG. 4C).

Smears remaining on the bottom of the laser vias (400a, 400b) are removed by a desmear treatment. Subsequently, a treatment such as electroless copper plating is conducted to form electroless plated films (401a, 401b) (see FIG. 4D). The electroless plated film (401a, 401b) can have a thickness in the range of, for example, about 2 to about 15 μm. Another treatment such as electrolytic copper plating is subsequently performed to form via conductors (43a, 43b) and electrolytic plated layers (402a, 402b) (see FIG. 4E).

Figure 4F:
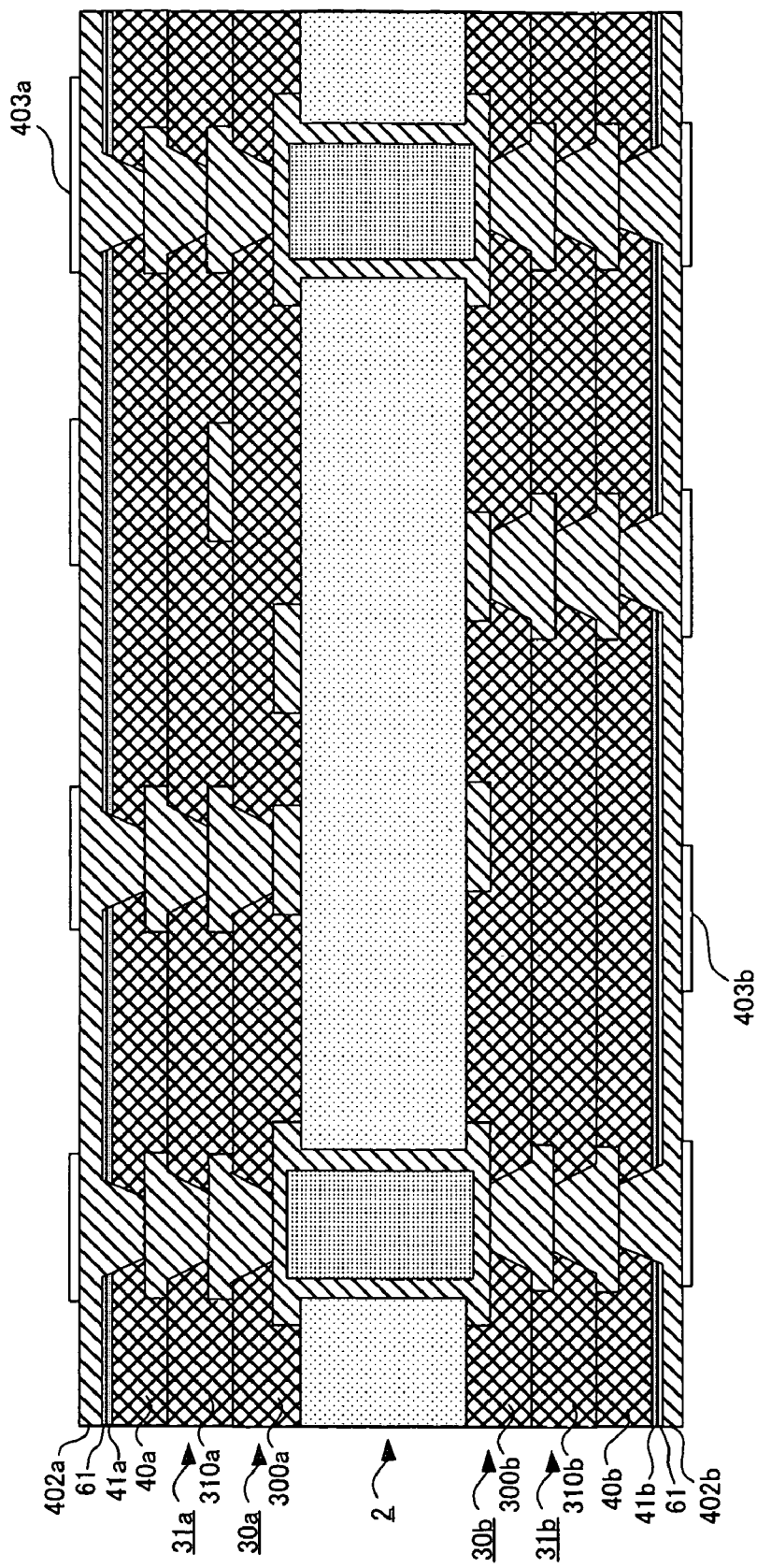
Figure 4G:
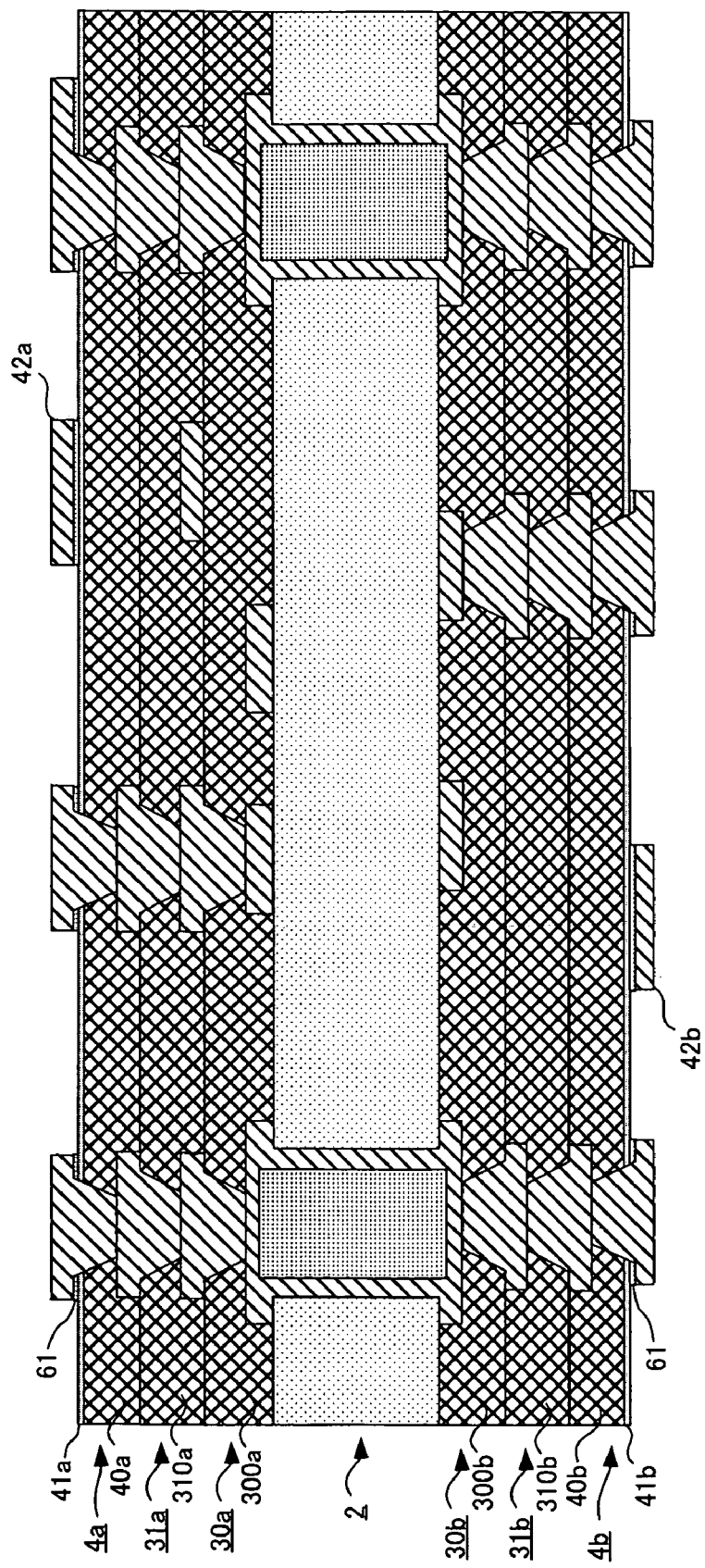
Figure 6:
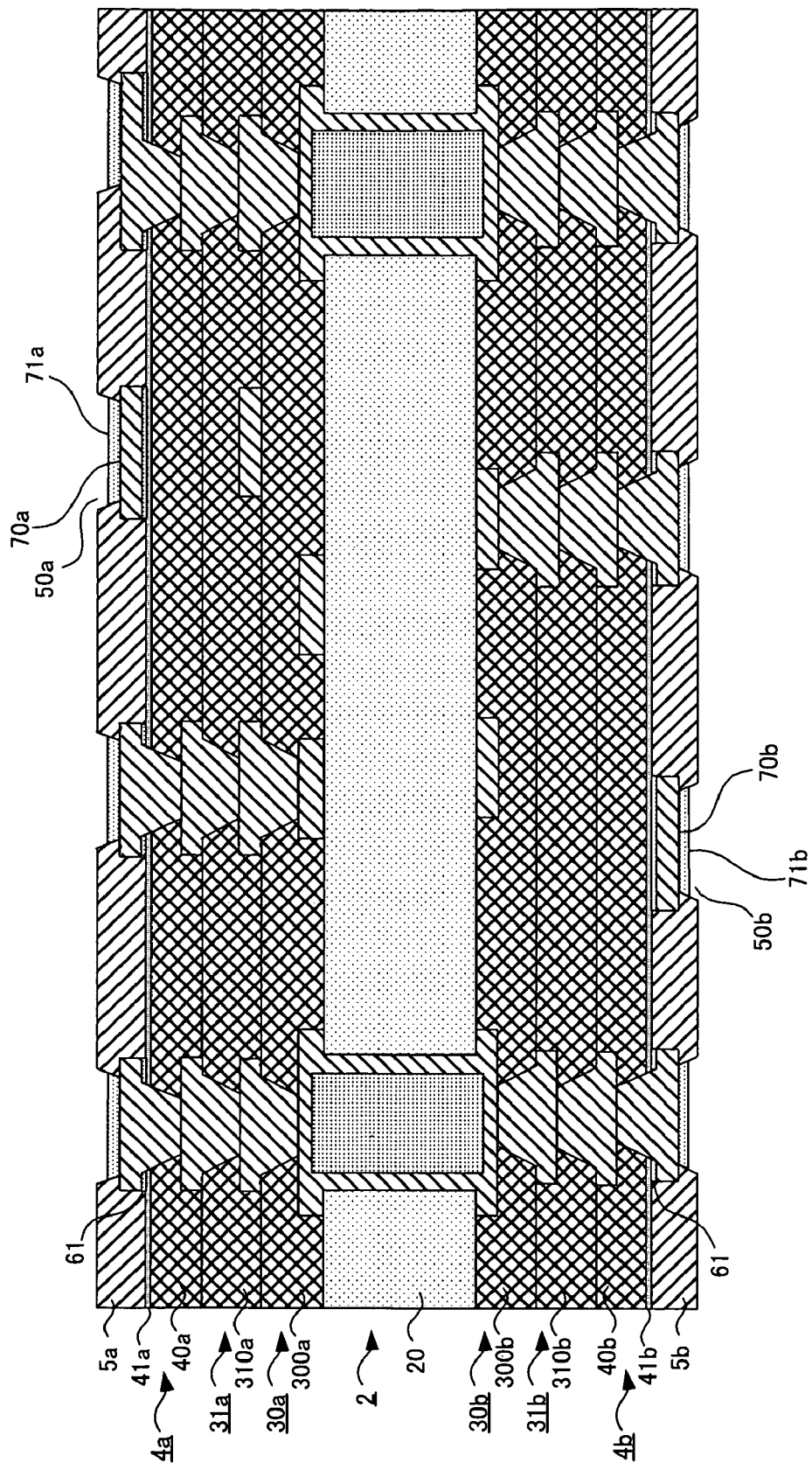
FIG. 6 is a cross-sectional view of the multilayer printed wiring board being manufactured by the method according to one embodiment of the present invention.
Figure 7:
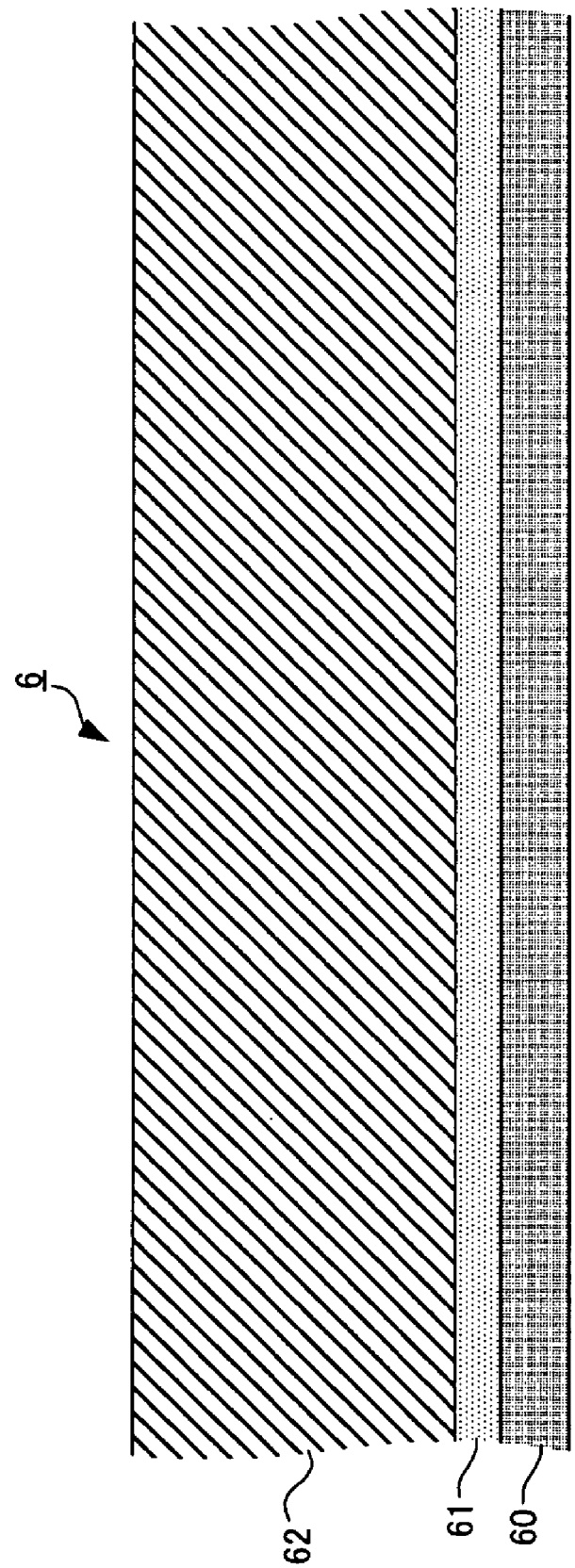
FIG. 7 is a cross-sectional view illustrating a multi-layered film used to form a resin complex layer in the multilayer printed wiring board of FIG. 1.

As shown in FIG. 4F, etching resists (403a, 403b) are formed on the surface of electrolytic plated layers (402a, 402b) to protect the portions that are not removed. The electrolytic plated layers (402a, 402b) and the adhesion support layers 61 are etched according to the etching pattern formed by the etching resists (403a, 403b). Thereafter, the etching resists (403a, 403b) are removed by etching, and conductive circuits (42a, 42b) are formed (see FIG. 4G). The surface layer structure (4a, 4b) having the insulation layer (40a, 40b), the resin complex layer (41a, 41b) and the conductive circuit (42a, 42b) is thus obtained.

The insulation layer (40a, 40b), the resin complex layer (41a, 41b) and the conductive circuit (42a, 42b) are firmly adhered to one another by the adhesion support layer 61. A secure adhesion of the insulation layer (40a, 40b), the resin complex layer (41a, 41b), and the conductive circuit (42a, 42b) is achieved regardless of factors such as the thickness or width of conductive circuit (42a, 42b). Also, sufficient adhesiveness is obtained without the need of roughening the resin complex layer (41a, 41b) or conductive circuit (42a, 42b). As such, the layered structure between the resin complex layer (41a, 41b) and conductive circuit (42a, 42b) is substantially flat. As a result, more secure electrical reliability is expected, and disruption in the conductivity of high-frequency current is minimized or effectively suppressed.

In this exemplary manufacturing process, a roughening treatment is not performed either on the resin complex layer (41a, 41b) or on the conductive circuit (42a, 42b). The conductive circuit (42a, 42b) is bonded to the resin complex layer (41a, 41b) through the adhesion support layer 61. The irregularities at the interface of the conductive circuit (42a, 42b) and the adhesion support layer 61 do not exceed about 1 μm in height. Accordingly, etching accuracy is enhanced, and side etching is minimized or reduced. Specifically, if a metallic film to be a conductive circuit is formed directly on an insulation layer and has greater surface irregularities, side etching or erosion of the side surfaces of the conductive circuit might occur during the process of removing a part of the metallic film to form the conductive circuit. If the surface has greater irregularities, side etching or erosion may occur to a greater degree, because etching the metallic film is conducted until the metallic material remaining in ditch portions of the irregularities is removed. On the other hand, the metallic film 62 in this embodiment is attached to the adhesion support layer 61 which is placed on the resin complex layer (41a, 41b), and the surface irregularities at the interface of the conductive circuit (42a, 42b) and the adhesion support layer 61 do not exceed about 1 μm in height. Thus, the width of the side etching can be reduced to 1 μm or less, and as a result, patterning accuracy is improved.

(4) Solder Resist Layers (5a, 5b)

Solder resist layers (5a, 5b) are formed over the resin complex layer (41a, 41b) as shown in FIG. 5A. For example, a liquid or dry-film photosensitive resist (solder resist) can be coated or laminated to form the solder resist layers (5a, 5b), and the thickness can be in the range of, for instance, about 5 to about 50 μm.

Subsequently, a photo-mask film with a circuit pattern or opening portion is adhered on the surface of the solder resist layer (5a, 5b), which is exposed to ultraviolet rays and developed with, for example, an alkaline solution. As a result, opening portion (50a, 50b) (see FIG. 5B) are formed in the solder resist layers (5a, 5b). The opening portions (50a, 50b) expose portions of conductive circuits (42a, 42b) which become pad portions (70a, 70b).

The solder resist layers (5a, 5b) protect the resin complex layers (41a, 41b) and unsoldered lands of pad portions (70a, 70b). As such, the entrance of moisture into the inner layers is reduced or prevented.

(5) Surface Treatment

A solder joint layer (71a, 71b) (FIG. 6) is formed on the pad portion (70a, 70b) to enhance solderability. For example, the solder joint layer (71a, 71b) can be a single or multiple layers formed by plating. One example of the solder joint layer (71a, 71b) is a two-layer structure having a nickel-plated layer with a thickness of about 1 to about 5 μm and a gold-plated layer with a thickness of about 0.01 to about 1 μm. The nickel-plated layer can be formed by immersion in an electroless nickel plating solution, and the gold-plated layer can be formed by immersion in an electroless gold plating solution. Another example of the solder joint layer (71a, 71b) is a three-layer structure of nickel-palladium-gold plated layers. Alternatively, it can be formed with a single gold-, silver- or tin-plated layer, or with a resin film of flux or the like.

Solder bumps (72a, 72b) are formed on the solder joint layer (71a, 71b) as illustrated in FIG. 1 by, for example, printing solder paste on the solder joint layer (71a, 71b) and performing a reflow process. The multilayer printed wiring board 1 thus produced is electrically connected to electronic components such as an IC chip by the solder bumps (72a, 72b).

In the multilayer printed wiring board 1, the pad portions (70a, 70b) are formed over the resin complex layer (41a, 41b) including a resin complex of thermosetting resins and thermoplastic resins. The resin complex layer (41a, 41b) is more viscous and has a higher tensile strength. As such, when tensile forces caused by external stresses such as heat, impact from vibration or drop impact are exerted on the joint between the pad portion (70a, 70b) and a terminal or the like of an electronic component, such forces are effectively off-set. Accordingly, a joint with excellent shear strength is obtained, and at the same time a highly densified and integrated structure is achieved. Further, a secure joint between the wiring board and the mounted electronic component is achieved. Accordingly, the reliability in quality is sufficient for the multilayer printed wiring board mounted in an electronic device for automobiles or cell phones, which tend to receive larger external stresses.

As described above, a highly integrated multilayer printed wiring board with a significant shear strength is provided. The printed wiring board for mounting an electronic component includes an insulation layer, a resin complex layer formed on the insulation layer, and pads for mounting an electronic component. The pads are formed over the resin complex layer containing a thermosetting resin and a thermoplastic resin. The multilayer printed wiring board can be manufactured by a method in which one or more insulation layers are formed on a core substrate, a resin complex layer containing a thermosetting resin and a thermoplastic resin is formed on an outermost insulation layer, and pads for connection to an electronic component are formed over the resin complex layer. The pads for connection to the electronic component are formed over the resin complex layer that contains a complex of thermosetting resins and thermoplastic resins and has a high tensile strength. As such, even if a tensile force caused by, for example, heat, vibration impact, or drop impact is exerted on the joint between the pad and terminal of the electronic component, the force is eased by the resin complex layer. Accordingly, a joint with good shear strength is obtained. The thermosetting resin is preferred to be one or more of epoxy resin, phenolic resin and polyimide resin. The thermoplastic resin is preferred to be one or more of polyethersulfone resin, phenoxy resin, fluoride resin, polyetherketone resin and aromatic polyamide. The thickness of the resin complex layer is preferred to be in the range of about 2 μm to about 4 μm. The pads are preferably formed on an adhesion support layer that is formed on the resin complex layer and contains one or more kinds of metals among zinc, nickel and chrome. The complex of the thermosetting resin and thermoplastic resin is preferred to contain about 20 to about 80 weight parts of the thermosetting resin and about 80 to about 20 weight parts of the thermoplastic resin. The bonded surfaces between the resin complex layer and pads are preferred not to be roughened. Also, the resin complex layer and the unsoldered land portions of the pads are preferred to be covered by a solder resist layer.

The present invention is not limited to the above-described embodiments, and various modifications may be practiced. For example, in the multilayer printed wiring board 1 of the above embodiment, the build-up layer structure (3a, 3b) includes two layers, that is, the first layer (30a, 30b) and second layer (31a, 31b). However, the build-up layer structure (3a, 3b) can have a single layer or three or more layers. Also, the number of layers in the build-up layer structure (3a, 3b) formed on each side of the core substrate 2 can be different, or the build-up layer structure (3a, 3b) can be formed on only one side of the core substrate 2. In addition, pad portions (70a, 70b) for connection to an electronic component can be formed on only one surface of the multilayer printed wiring board 1.

The following examples further illustrate the invention but, of course, should not be construed as in any way limiting its scope.

EXAMPLE

This example demonstrates how the shearing strength of a solder joint is affected by a layer structure provided underneath the solder joint of a multilayer printed wiring board. Sample 1 and Sample 2 are prepared for ball shear tests as follows.

(1) Preparation of Sample 1

(a) A metal layer (thickness: 3.0 μm) comprising epoxy resin containing nickel is placed on a copper foil (thickness: 25 μm), and a resin layer (thickness: 4.0 μm) comprising a resin complex of epoxy and polyethersulfone is placed on the metal layer. The metal layer, the resin layer, and the copper foil are thermopressed. The copper foil with the two layers is placed on a base substrate made of bismaleimide triazine (BT) resin (thickness: 0.8 μm).

(b) An electroless copper plating treatment and an electrolytic copper plating treatment are conducted to form a conductive layer on the copper film.

(c) Pads for soldering are formed by patterning the conductive layer.

(d) A treatment using organic solderability preservatives (OSP) is performed on the pads to form a preflux (anti-corrosive coating) on the surface of the pads.

(e) Solder paste is printed on the pads and ball-shaped solder bumps (solder balls) are formed through a reflow process. The solder paste is made of tin-silver-copper and is a lead-free type. The ratio of silver to copper in the solder paste is 3.5 to 0.5.

(2) Preparation of Sample 2

A copper foil having a resin layer containing epoxy resin attached thereto is laminated on a base substrate made of BT resin. The BT resin has a thickness of 0.8 mm, the copper foil has a thickness of 25 μm, and the resin layer has a thickness of 4 μm. Sample 2 is prepared similarly to (b)-(e) above.

Figure 9:
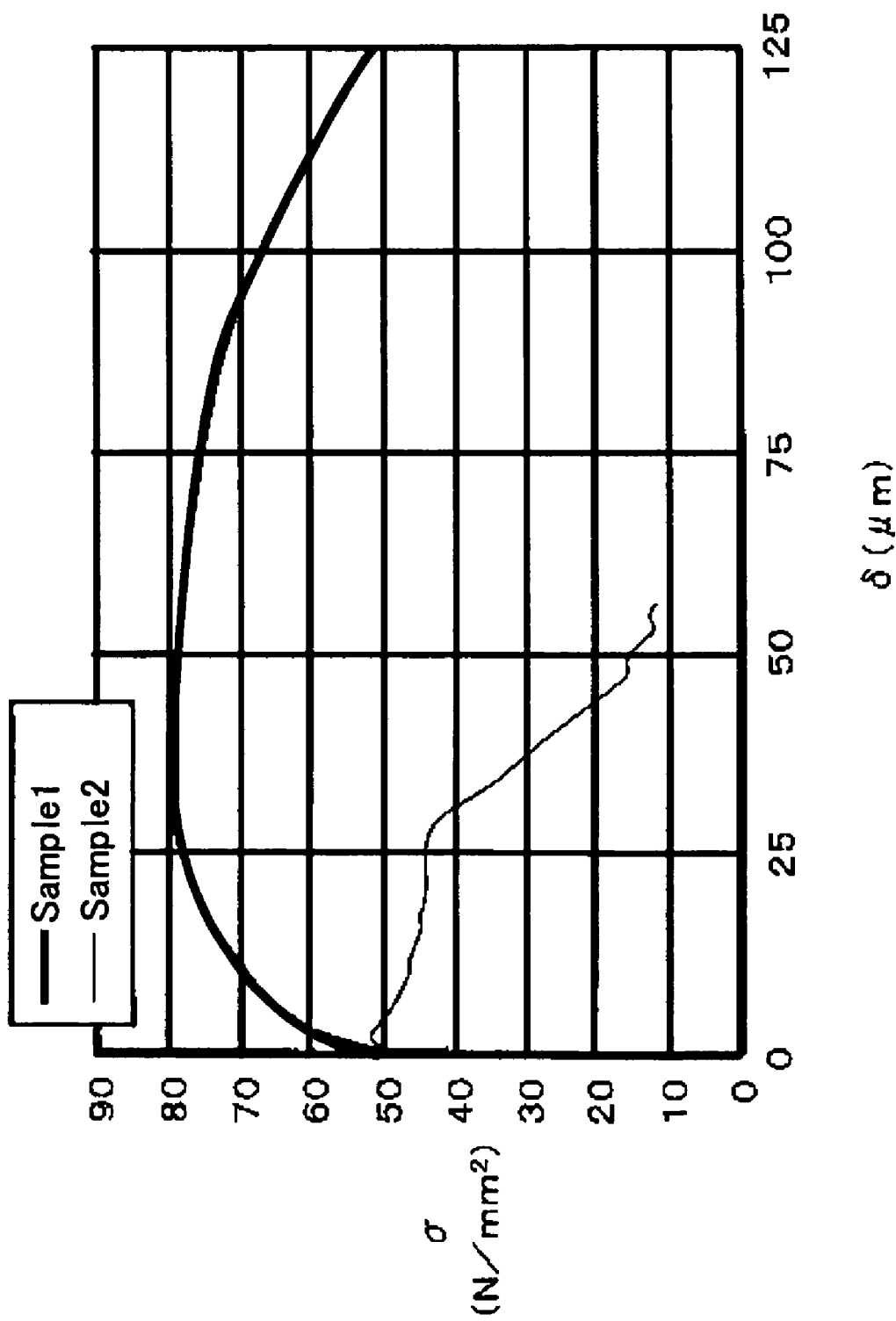
FIG. 9 is a graph showing results of a ball shear test conducted at a lower speed to measure the connection strength between a pad and a solder ball formed on the pad.
Figure 10:
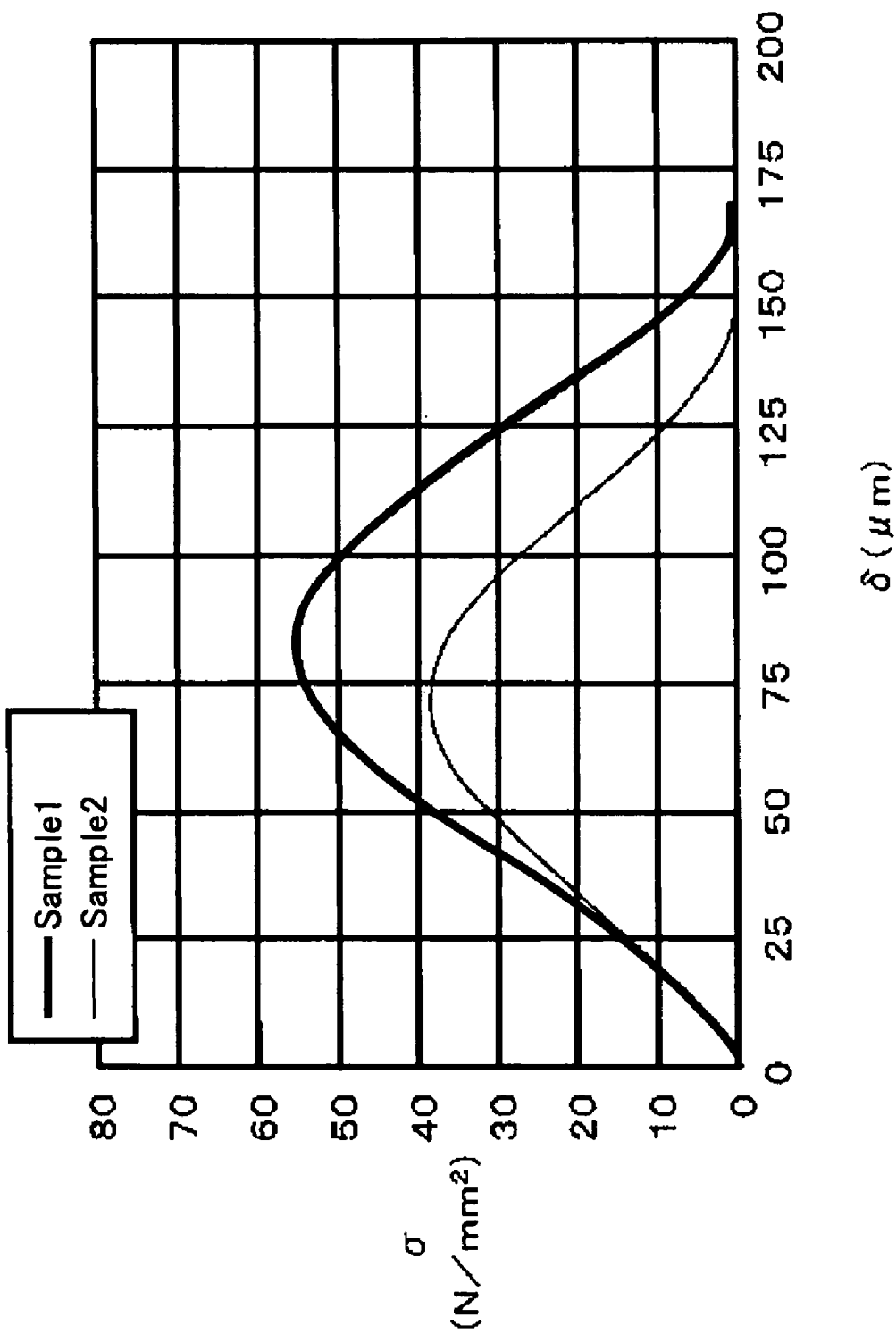
FIG. 10 is a graph showing results of a ball shear test conducted at a higher speed to measure the connection strength between a pad and a solder ball formed on the pad.
Figure 11:
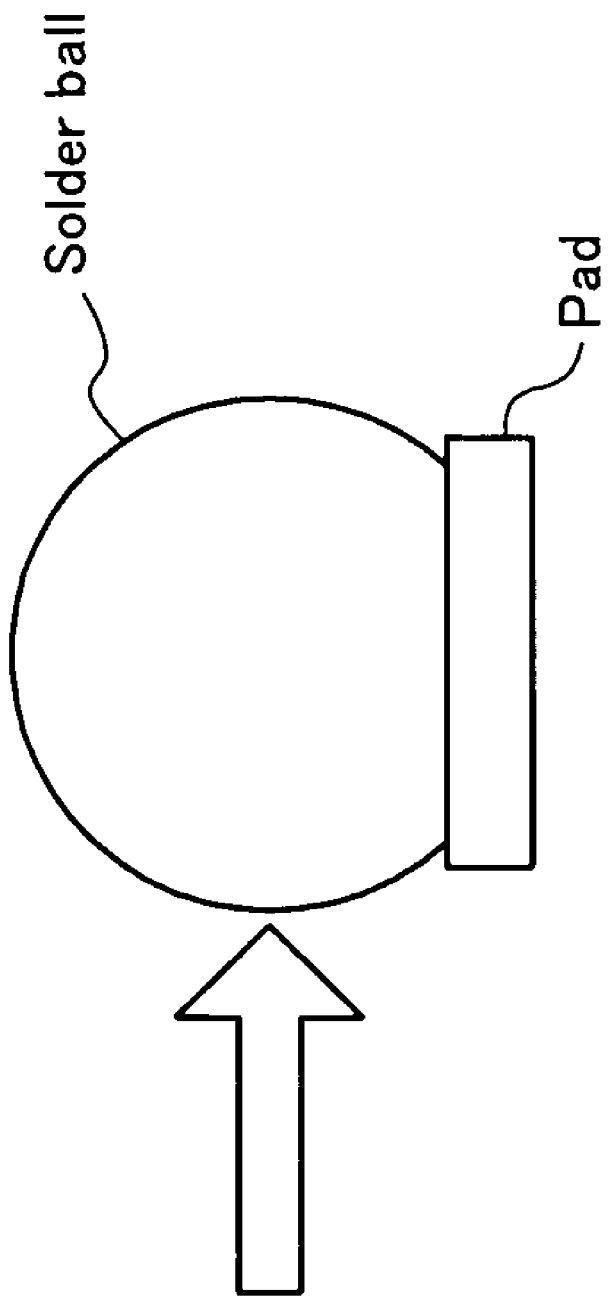
FIG. 11 is a schematic illustration of a solder ball and a pad used in a ball shear test.

Using Sample 1 and Sample 2 prepared above, ball shear tests were conducted to measure the force required to disconnect the joint. FIG. 11 is a schematic illustration of a solder ball formed on a pad, and the arrow indicates the direction of force applied to the solder pad by a shear tool to test the shear strength of the solder joint. FIG. 9 shows the test results for Samples 1 and 2 when the force was applied at a lower speed (0.5 mm/sec). FIG. 10 shows the results for Samples 1 and 2 when the force was applied at a higher speed (4,000 mm/sec). Both graphs show the amount of horizontal displacement $\delta(\mu m)$ of the tool and the force $\sigma(N/mm^2)$ applied to the pad. In the graphs of FIGS. 9 and 10, the thicker line corresponds to Sample 1, and the thinner line corresponds to Sample 2. In both of the high-speed and low-speed tests, a larger force was required to shear the bond of Sample 1 as compared to Sample 2, and excellent bonding strength (shear strength) of Sample 1 as compared to Sample 2 was demonstrated.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A method for manufacturing a multilayer printed wiring board, comprising:
   providing a core substrate;
   forming an insulation layer comprising a thermosetting resin material over the core substrate;
   placing an uncured resin layer comprising a thermoplastic resin material on the insulation layer;
   curing the uncured resin layer to form a resin complex layer including a resin complex comprising the thermosetting resin material and the thermoplastic resin material; and
   forming a conductive circuit over the resin complex layer,
   wherein the placing of the uncured resin layer includes forming an adhesion support layer over the uncured resin layer, forming a metallic film over the adhesion support layer, and placing on the insulation layer the uncured resin layer over which the adhesion support layer and the metallic film are formed.

2. The method of claim 1, wherein the forming of the adhesion support layer comprises including in the adhesion support layer a metal different from a metal included in the metallic film.

3. The method of claim 1, wherein the forming of the adhesion support layer comprises including in the adhesion support layer at least one metal selected from the group consisting of zinc, nickel and chrome.

4. The method of claim 1, wherein the forming of the conductive circuit includes etching the metallic film, forming an electroless plated film on the metallic film, forming an electrolytic plated film on the electroless plated film, and patterning the electrolytic plated film.

5. The method of claim 1, wherein the forming of the metallic film over the adhesion support layer comprises laminating the metallic film on the adhesion support layer and adhering the metallic film to the adhesion support layer without roughening a surface of the metallic film.

6. The method of claim 1, wherein the forming of the adhesion support layer over the uncured resin layer comprises forming the adhesion support layer directly on the uncured resin layer without roughening a surface of the uncured resin layer.

7. The method of claim 1, wherein the forming of the insulation layer comprises including in the insulation layer at least one thermosetting resin material selected from the group consisting of an epoxy resin, a phenolic resin and a polyimide resin.

8. The method of claim 1, wherein the forming of the uncured resin layer comprises including in the insulation layer at least one thermoplastic resin material selected from the group consisting of a polyethersulfone resin, a phenoxy resin, a fluoride resin, a polyetherketone resin and an aromatic polyamide.

9. The method of claim 1, wherein the forming of the resin complex layer comprises forming the resin complex layer having a thickness of about 2 μm to about 4 μm.

10. The method of claim 1, wherein the forming of the resin complex layer comprises forming the resin complex layer including the resin complex comprising about 20 to about 80 weight parts of the thermosetting resin material and about 80 to about 20 weight parts of the thermoplastic resin material.

11. The method of claim 1, further comprising:
   forming a pad portion on the conductive circuit for connection to an electronic component; and
   forming a solder resist layer over the resin complex layer and an unsoldered land of the pad portion.

12. The method of claim 1, wherein the forming of the adhesion support layer comprises including in the adhesion support layer a metal different from a metal included in the metallic film, and the forming of the conductive circuit includes etching the metallic film, forming an electroless plated film on the metallic film, forming an electrolytic plated film on the electroless plated film, and patterning the electrolytic plated film.

13. The method of claim 1, wherein the forming of the adhesion support layer comprises including in the adhesion support layer at least one metal selected from the group consisting of zinc, nickel and chrome, and the forming of the conductive circuit includes etching the metallic film, forming an electroless plated film on the metallic film, forming an electrolytic plated film on the electroless plated film, and patterning the electrolytic plated film.

14. The method of claim 1, wherein the forming of the metallic film over the adhesion support layer comprises laminating the metallic film on the adhesion support layer and adhering the metallic film to the adhesion support layer without roughening a surface of the metallic film, and the forming of the conductive circuit includes etching the metallic film, forming an electroless plated film on the metallic film, forming an electrolytic plated film on the electroless plated film, and patterning the electrolytic plated film.

15. The method of claim 1, wherein the forming of the metallic film over the adhesion support layer comprises laminating the metallic film on the adhesion support layer and adhering the metallic film to the adhesion support layer without roughening a surface of the metallic film, and the forming of the adhesion support layer over the uncured resin layer comprises forming the adhesion support layer directly on the uncured resin layer without roughening a surface of the uncured resin layer.

16. The method of claim 1, wherein the forming of the adhesion support layer over the uncured resin layer comprises forming the adhesion support layer directly on the uncured resin layer without roughening a surface of the uncured resin layer, and the forming of the resin complex layer comprises forming the resin complex layer having a thickness of about 2 µm to about 4 µm.

17. The method of claim 1, wherein the forming of the insulation layer comprises including in the insulation layer at least one thermosetting resin material selected from the group consisting of an epoxy resin, a phenolic resin and a polyimide resin, and the forming of the uncured resin layer comprises including in the insulation layer at least one thermoplastic resin material selected from the group consisting of a polyethersulfone resin, a phenoxy resin, a fluoride resin, a polyetherketone resin and an aromatic polyamide.

18. The method of claim 1, wherein the forming of the uncured resin layer comprises including in the insulation layer at least one thermoplastic resin material selected from the group consisting of a polyethersulfone resin, a phenoxy resin, a fluoride resin, a polyetherketone resin and an aromatic polyamide, and the forming of the resin complex layer comprises forming the resin complex layer including the resin complex comprising about 20 to about 80 weight parts of the thermosetting resin material and about 80 to about 20 weight parts of the thermoplastic resin material.

19. The method of claim 1, wherein the forming of the resin complex layer comprises forming the resin complex layer having a thickness of about 2 µm to about 4 µm, and the forming of the resin complex layer comprises forming the resin complex layer including the resin complex comprising about 20 to about 80 weight parts of the thermosetting resin material and about 80 to about 20 weight parts of the thermoplastic resin material.

20. The method of claim 1, wherein the forming of the resin complex layer comprises forming the resin complex layer including the resin complex comprising about 20 to about 80 weight parts of the thermosetting resin material and about 80 to about 20 weight parts of the thermoplastic resin material, and the forming of the resin complex layer comprises forming the resin complex layer having a thickness of about 2 µm to about 4 µm.

21. The method of claim 1, further comprising:
  forming a pad portion on the conductive circuit for connection to an electronic component; and
  forming a solder resist layer over the resin complex layer and an unsoldered land of the pad portion,
  wherein the forming of the resin complex layer comprises forming the resin complex layer having a thickness of about 2 µm to about 4 µm.

22. The method of claim 1, further comprising forming a pad portion on the conductive circuit for connection to an electronic component.

* * * * *